(12) United States Patent
Lee et al.

(10) Patent No.: US 11,069,776 B2
(45) Date of Patent: Jul. 20, 2021

(54) SEMICONDUCTOR DEVICE

(71) Applicant: Samsung Electronics Co., Ltd., Suwon-si (KR)

(72) Inventors: Sanggil Lee, Ansan-si (KR); Namkyu Cho, Seongnam-si (KR); Seokhoon Kim, Suwon-si (KR); Kang Hun Moon, Hwaseong-si (KR); Hyun-Kwan Yu, Suwon-si (KR); Sihyung Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/789,498

(22) Filed: Feb. 13, 2020

(65) Prior Publication Data

US 2021/0043730 A1 Feb. 11, 2021

(30) Foreign Application Priority Data

Aug. 7, 2019 (KR) .......................... 10-2019-0095991

(51) Int. Cl.
| | | |
|---|---|---|
| H01L 29/08 | (2006.01) |
| H01L 29/06 | (2006.01) |
| H01L 29/78 | (2006.01) |
| H01L 29/66 | (2006.01) |
| H01L 21/762 | (2006.01) |

(52) U.S. Cl.
CPC ...... H01L 29/0847 (2013.01); H01L 29/0649 (2013.01); H01L 29/66795 (2013.01); H01L 29/7851 (2013.01); *H01L 21/76224* (2013.01); *H01L 29/7848* (2013.01)

(58) Field of Classification Search
CPC ............. H01L 29/0847; H01L 29/0649; H01L 29/7854; H01L 29/66795; H01L 29/7848; H01L 29/66545; H01L 29/161; H01L 29/165; H01L 21/76224
USPC ......... 257/401, 190, 408, E21.409, E21.632, 257/E29.242; 438/230, 285, 301, 303
See application file for complete search history.

(56) References Cited

U.S. PATENT DOCUMENTS

| | | | |
|---|---|---|---|
| 8,358,012 B2* | 1/2013 | Haran | ............... H01L 21/76895 257/774 |
| 8,940,595 B2 | 1/2015 | Chandra et al. | |
| 9,214,530 B2* | 12/2015 | Shin | ...................... H01L 29/167 |
| 9,466,721 B1 | 10/2016 | Kim et al. | |
| 9,570,580 B1 | 2/2017 | Chiang et al. | |
| 10,079,305 B2 | 9/2018 | Lee et al. | |
| 10,734,520 B2* | 8/2020 | Sung | ................. H01L 21/02057 |
| 2012/0205715 A1* | 8/2012 | Kwok | ................. H01L 29/0847 257/190 |
| 2018/0175172 A1 | 6/2018 | Chang et al. | |
| 2018/0286862 A1 | 10/2018 | Chao et al. | |
| 2019/0096770 A1 | 3/2019 | Hong et al. | |
| 2019/0097006 A1* | 3/2019 | Li | ..................... H01L 29/41725 |

(Continued)

*Primary Examiner* — Dao H Nguyen
(74) *Attorney, Agent, or Firm* — Muir Patent Law, PLLC

(57) ABSTRACT

Disclosed is a semiconductor device including a first active pattern that extends in a first direction on an active region of a substrate, a first source/drain pattern in a recess on an upper portion of the first active pattern, a gate electrode that runs across a first channel pattern on the upper portion of the first active pattern and extends in a second direction intersecting the first direction, and an active contact electrically connected to the first source/drain pattern.

20 Claims, 27 Drawing Sheets

(56) References Cited

U.S. PATENT DOCUMENTS

2019/0123201 A1    4/2019  Li et al.
2020/0313001 A1*  10/2020  Keech ............... H01L 21/02579

* cited by examiner

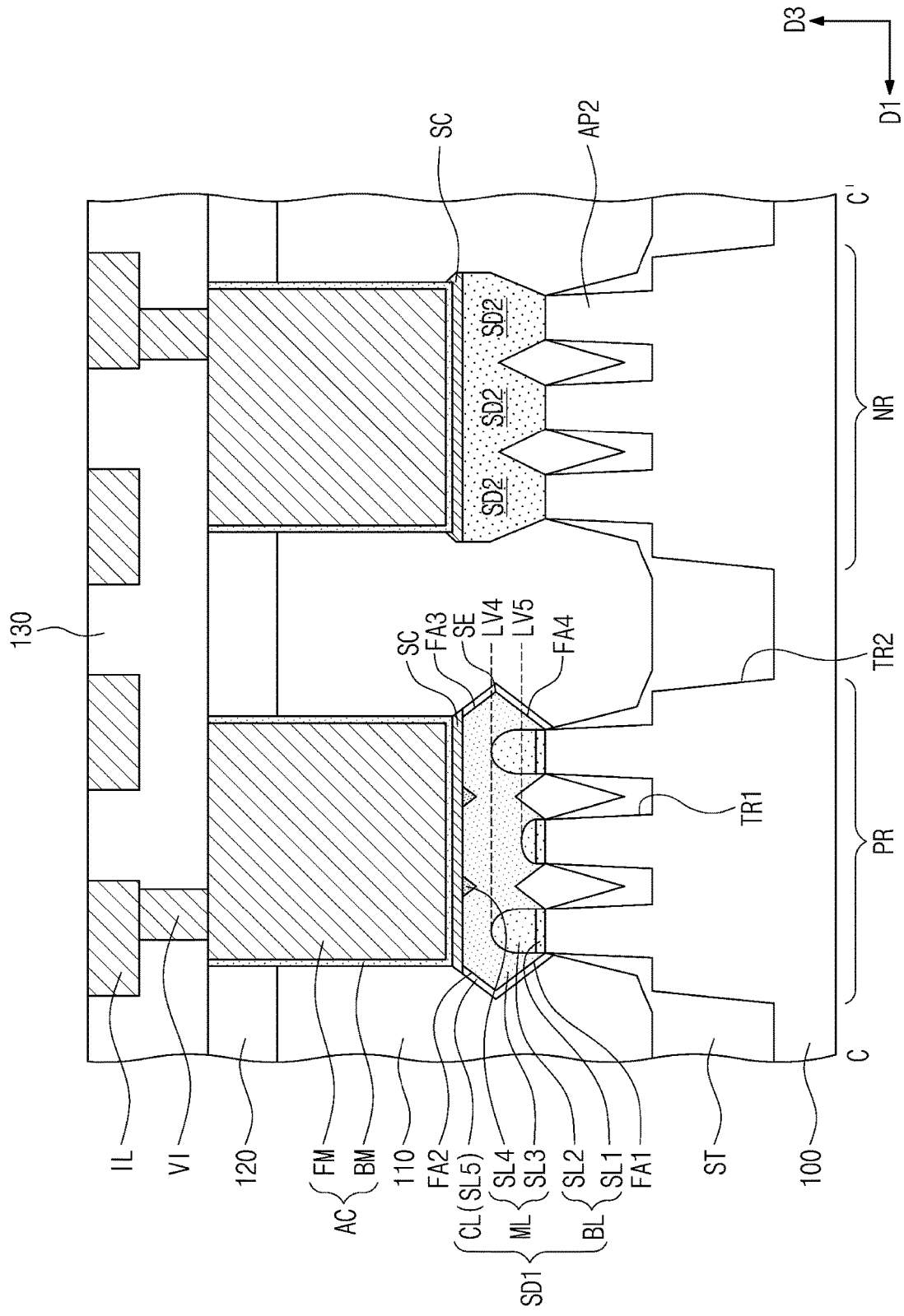

SEMICONDUCTOR DEVICE

CROSS-REFERENCE TO RELATED APPLICATION

This U.S. nonprovisional application claims priority under 35 U.S.C § 119 to Korean Patent Application No. 10-2019-0095991 filed on Aug. 7, 2019 in the Korean Intellectual Property Office, the disclosures of which are hereby incorporated by reference in their entirety.

BACKGROUND

The present inventive concepts relate to a semiconductor device, and more particularly, to a semiconductor device including a field effect transistor and a method of fabricating the same.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices have been gradually complicated and integrated to meet these requested characteristics.

SUMMARY

Some example embodiments of the present inventive concepts provide a semiconductor device with improved electrical characteristics.

According to some example embodiments of the present inventive concepts, a semiconductor device includes a first active pattern that extends in a first direction on a first active region of a substrate, a first source/drain pattern in a recess on an upper portion of the first active pattern, a gate electrode that runs across a first channel pattern on the upper portion of the first active pattern, wherein the gate electrode extends in a second direction different from the first direction and is provided on a top surface and at least one sidewall of the first channel pattern, and an active contact electrically connected to the first source/drain pattern. The recess, when viewed in a cross-section of the first active pattern taken along the first direction, includes a first inner sidewall that extends, at a first angle with respect to a bottom surface of the substrate, from a top surface of the first active pattern toward the first channel pattern, and a second inner sidewall that extends, at a second angle with respect to the bottom surface of the substrate different from the first angle, from the first inner sidewall toward a bottom of the recess. The first source/drain pattern includes a first layer in a lower portion of the recess and a second layer on the first layer. The first layer covers the second inner sidewall. The second layer covers at least a portion of the first inner sidewall. The at least a portion of the first inner sidewall is exposed by the first layer. The first layer has a side part on the second inner sidewall and a central part on the bottom of the recess. The side part is at a height higher than a height at which the central part is. The first layer and the second layer include silicon-germanium (SiGe). A concentration of germanium (Ge) in the first layer is in a range from 10 at % to 45 at %. A concentration of germanium (Ge) in the second layer is in a range from 50 at % to 70 at %.

According to some example embodiments of the present inventive concepts, a semiconductor device includes a first active pattern, a second active pattern, and a third active pattern that are on an active region of a substrate, wherein the first to third active patterns extend in parallel to each other in a first direction and are spaced apart from each other in a second direction intersecting the first direction, a device isolation layer that is on the substrate and covers a lower sidewall of each of the first to third active patterns, wherein an upper portion of each of the first to third active patterns protrudes upwards from a top surface of the device isolation layer, a source/drain pattern continuously on the first to third active patterns, a gate electrode that runs across the first to third active patterns, and an active contact electrically connected to the source/drain pattern. The source/drain pattern includes first to third first layers on the first to third active patterns respectively and spaced apart from each other in the second direction, and a second layer continuously disposed on the first to third first layers. A height of the first layer, when viewed in a cross-section of the source/drain pattern taken along the second direction, is higher than a height of the second first layer. A height of the third first layer is higher than the height of the second first layer. The first to third first layers and the second layer include silicon-germanium (SiGe). A concentration of germanium (Ge) in each of the first to third first layers is in a range from 10 at % to 45 at %. A concentration of germanium (Ge) in the second layer is in a range from 50 at % to 70 at %.

According to some example embodiments of the present inventive concepts, a semiconductor device includes an active pattern that extends in a first direction on a PMOSFET region of a substrate, a device isolation layer that is on the substrate and covers a lower sidewall of the active pattern, an upper portion of the active pattern protruding upwards from a top surface of the device isolation layer, a source/drain pattern in a recess between channels on the upper portion of the active pattern, a gate electrode that runs across the upper portion of the active pattern, the gate electrode extending in a second direction different from the first direction, a first interlayer dielectric layer on the source/drain pattern and the gate electrode, a second interlayer dielectric layer on the first interlayer dielectric layer, an active contact that penetrates the first and second interlayer dielectric layers and has electrical connection with the source/drain pattern, a gate contact that penetrates the second interlayer dielectric layer and has electrical connection with the gate electrode, a silicide pattern between the source/drain pattern and the active contact, a third interlayer dielectric layer on the second interlayer dielectric layer, a first connection line and a second connection line in the third interlayer dielectric layer, a first via in the third interlayer dielectric layer that electrically connects the first connection line to the active contact, and a second via in the third interlayer dielectric layer that electrically connects the second connection line to the gate contact. The recess, when viewed in a cross-section of the active pattern taken along the first direction, includes a first inner sidewall that extends, at a first angle with respect to a bottom surface of the substrate, from a top surface of the active pattern toward the channel, and a second inner sidewall that extends, at a second angle with respect to the bottom surface of the substrate different from the first angle, from the first inner sidewall toward a bottom of the recess. The source/drain pattern includes a first layer in a lower portion of the recess and a second layer on the first layer. The first layer covers the second inner sidewall. The second layer covers at least a portion of the first inner sidewall. The at least a portion of the first inner sidewall is exposed by the first layer. The first layer includes a side part on the second inner sidewall and a central part on the bottom of the recess. The side part is at a height higher than a height at which the central part is. The first layer and the second layer include silicon-germanium (SiGe). A concentration of germanium (Ge) in the first layer is in a range from 10 at % to 45 at %. A concentration of germanium (Ge) in the second layer is in a range from 50 at % to 70 at %.

BRIEF DESCRIPTION OF THE DRAWINGS

FIGS. 2A, 2B, 2C, and 2D illustrate cross-sectional views respectively taken along lines A-A', B-B', C-C', and D-D' of FIG. 1.

DETAILED DESCRIPTION OF EMBODIMENTS

Figure 1:
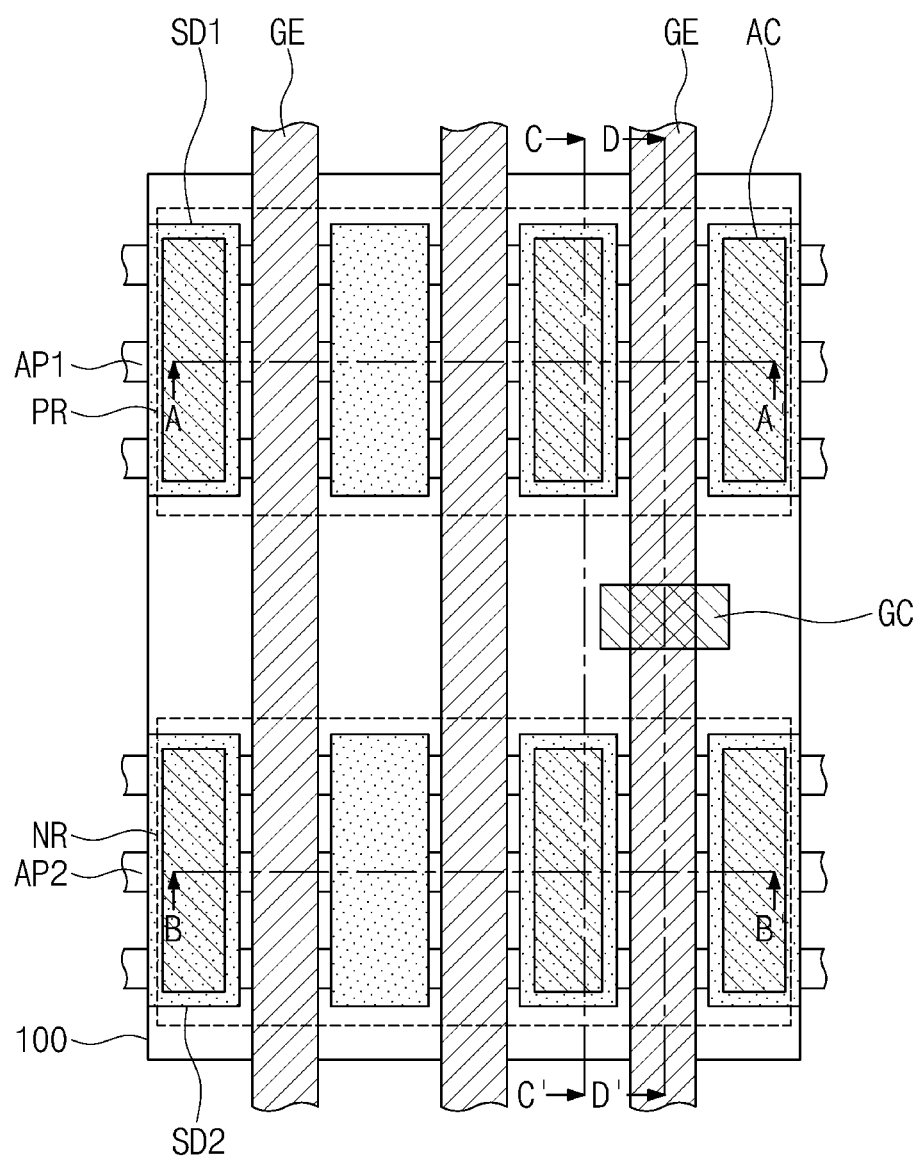
FIG. 1 illustrates a plan view showing a semiconductor device according to some example embodiments of the present inventive concepts.
Figure 1:
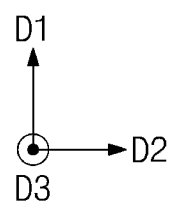
Figure 2A:
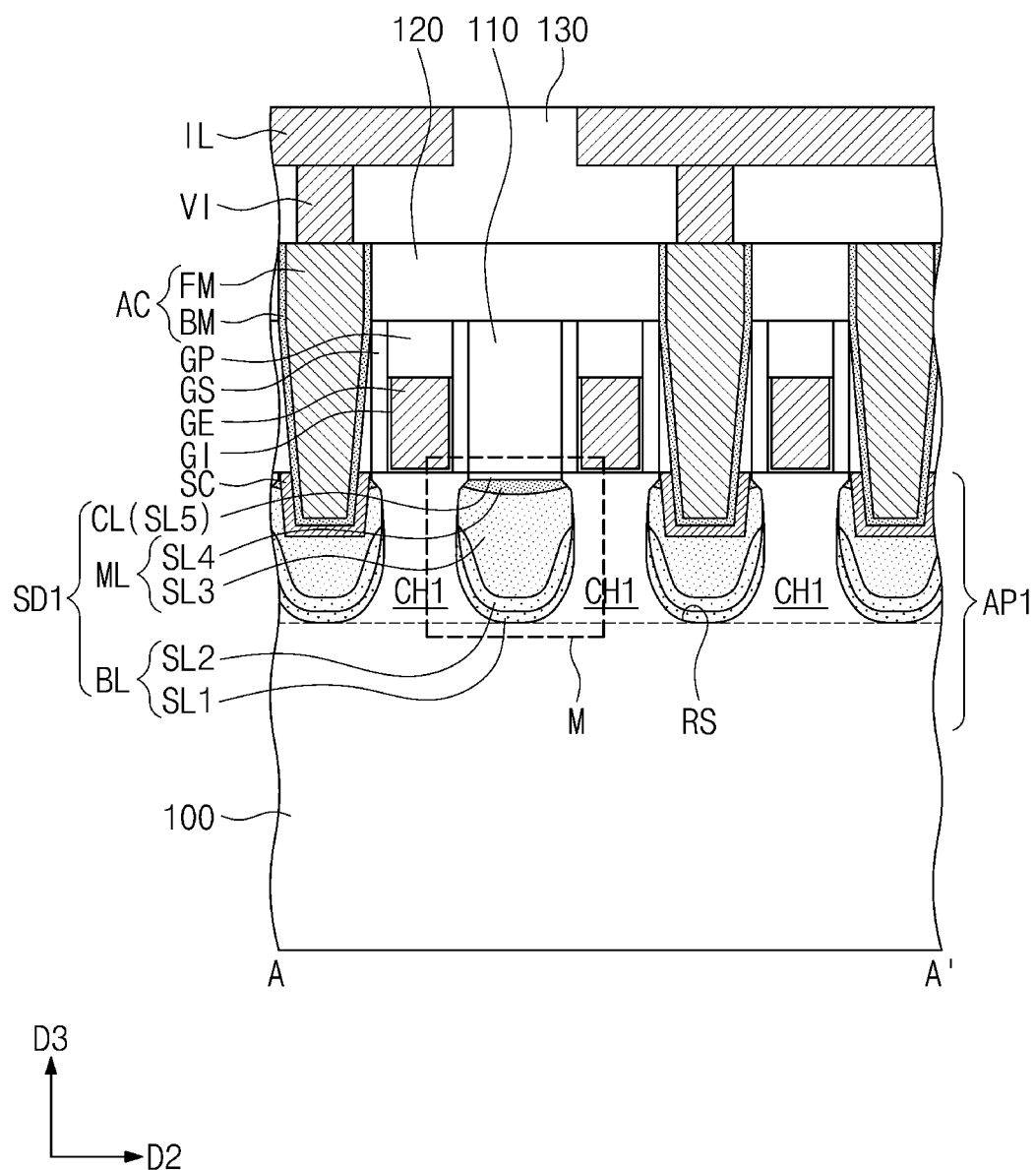
Figure 2B:
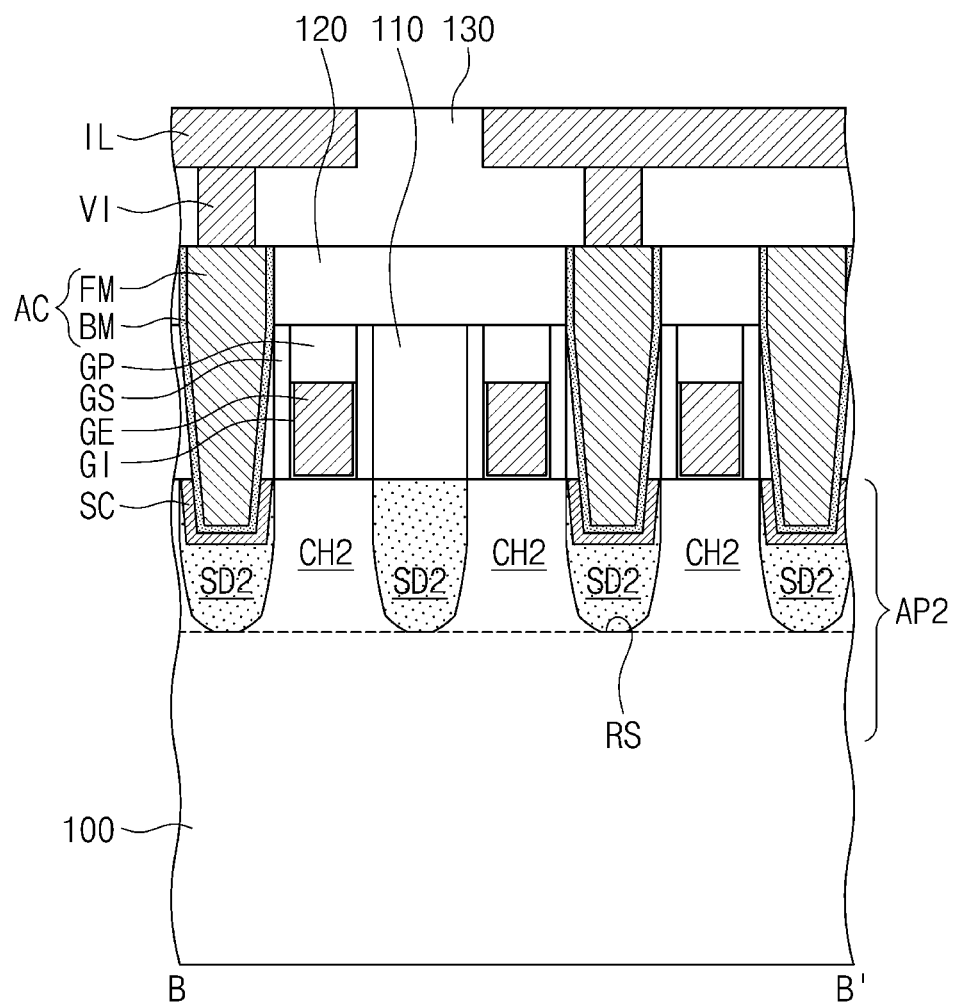
Figure 2D:
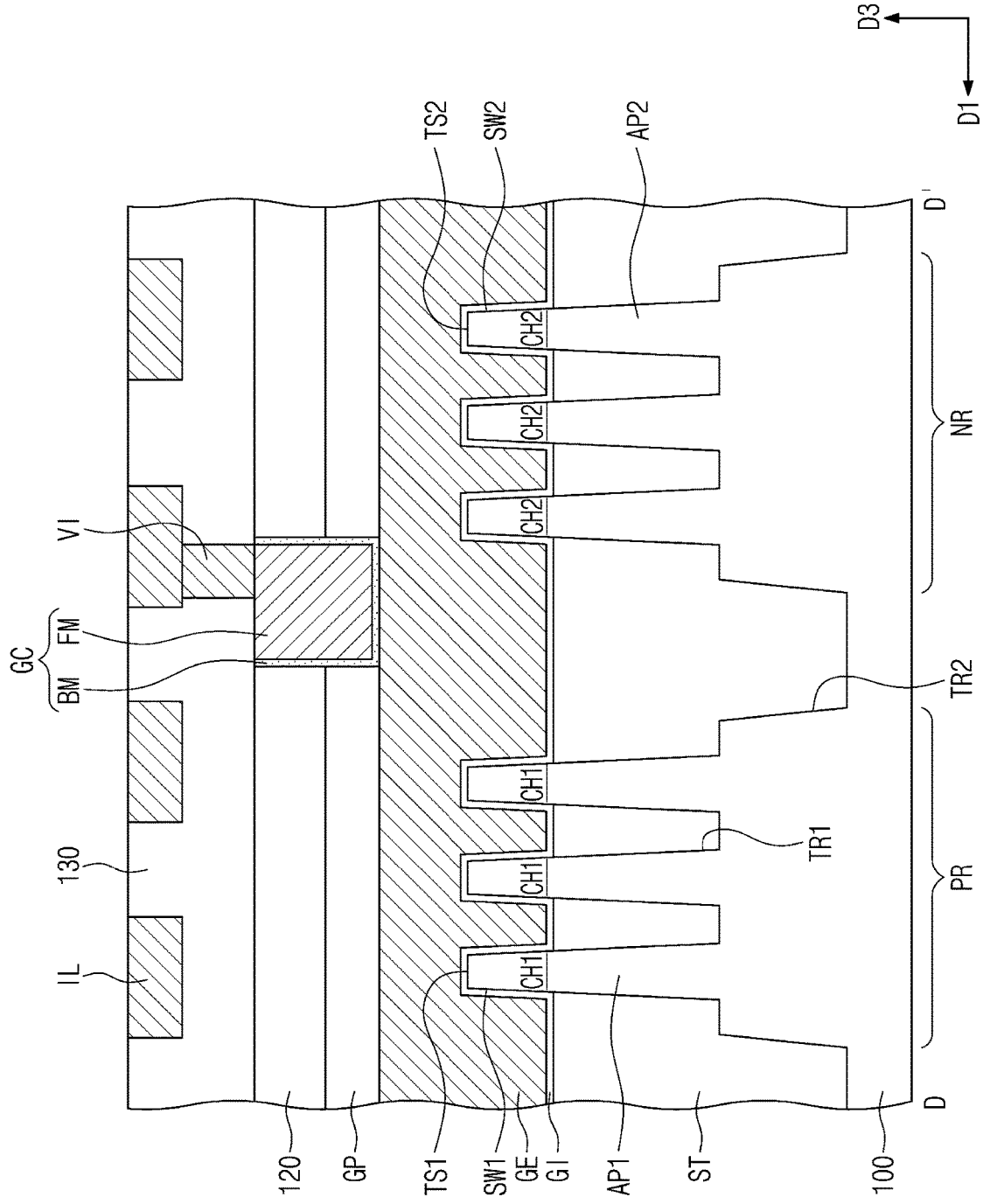
Figure 3:
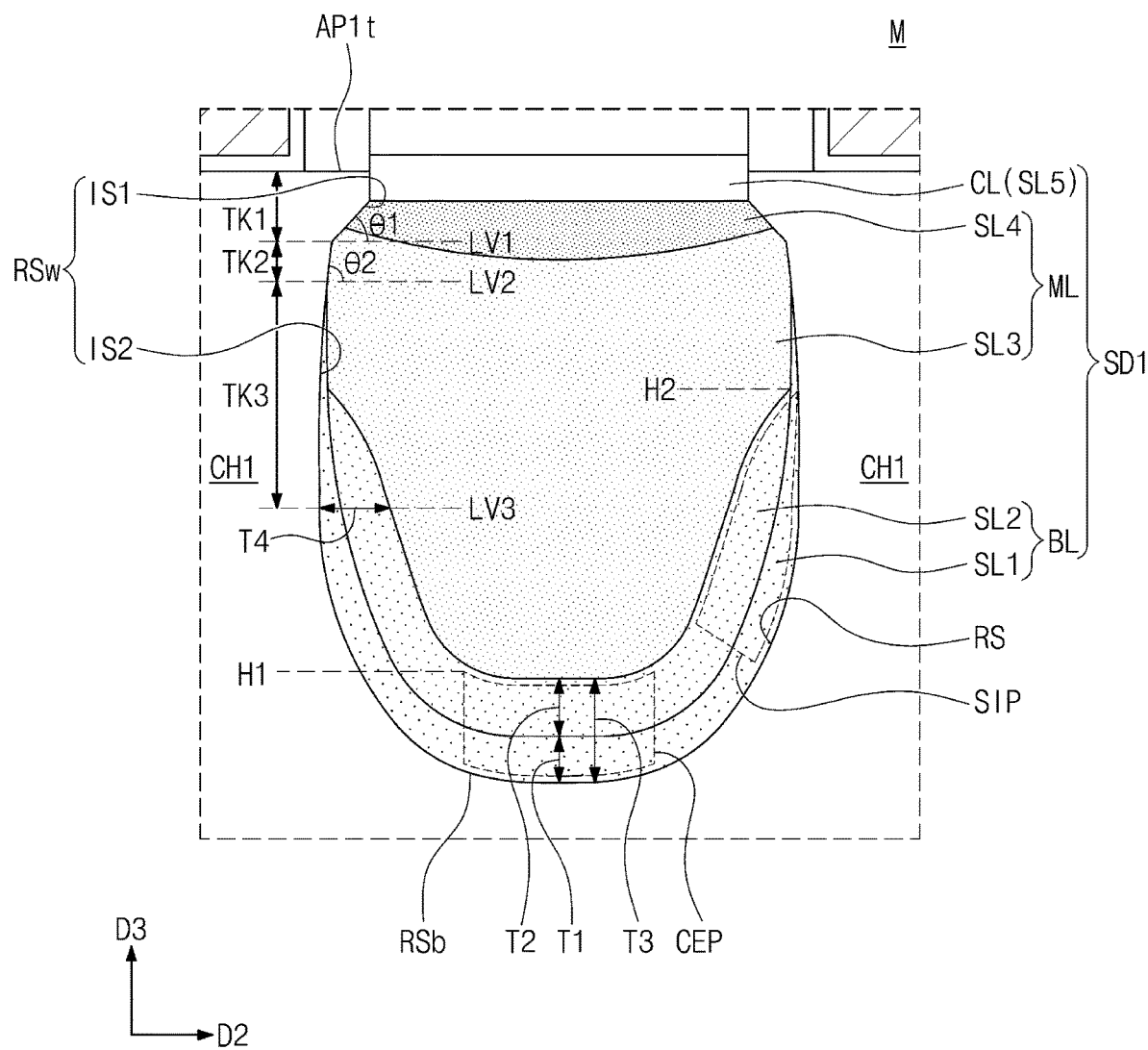
FIG. 3 illustrates an enlarged cross-sectional view showing section M of FIG. 2A.

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1. FIG. 3 illustrates an enlarged cross-sectional view showing section M of FIG. 2A.

Referring to FIGS. 1, 2A to 2D, and 3, a substrate 100 may be provided which includes a first active region PR and a second active region NR. The substrate 100 may be a compound semiconductor substrate or a semiconductor substrate including silicon, germanium, silicon-germanium, or the like. For example, the substrate 100 may be a silicon substrate.

In an embodiment of the present inventive concepts, the first and second active regions PR and NR may each be a logic cell region that includes logic transistors constituting a logic circuit of a semiconductor device. For example, the logic cell region of the substrate 100 may include logic transistors that constitute a logic circuit. The first and second active regions PR and NR may include at least one of the logic transistors. The first active region PR may be a positive (i.e., p-channel) metal oxide semiconductor field effect transistor (PMOSFET) region, and the second active region NR may be a negative (i.e., n-channel) metal oxide semiconductor field effect transistor (NMOSFET) region.

The first and second active regions PR and NR may be defined by a second trench TR2 formed on an upper portion of the substrate 100. The second trench TR2 may be positioned between the first and second active regions PR and NR. The first and second active regions PR and NR may be spaced apart from each other in a first direction D1 across the second trench TR2. Each of the first and second active regions PR and NR may extend in a second direction D2 intersecting the first direction D1.

First active patterns AP1 and second active patterns AP2 may be respectively provided on the first active region PR and the second active region NR. The first and second active patterns AP1 and AP2 may extend in parallel to each other in the second direction D2. The first and second active patterns AP1 and AP2 may be vertically protruding portions of the substrate 100. A first trench TR1 may be defined between adjacent first active patterns AP1 and between adjacent second active patterns AP2. The first trench TR1 may be shallower than the second trench TR2.

A device isolation layer ST may fill the first and second trenches TR1 and TR2. The device isolation layer ST may include a silicon oxide layer. The first and second active patterns AP1 and AP2 may have their upper portions that protrude vertically upwards from the device isolation layer ST (see FIG. 2D). Each of the upper portions of the first and second active patterns AP1 and AP2 may have a fin shape. For example, the fin shape of each of the first and second active patterns AP1 and AP2 may protrude from a top surface of the substrate 100. In some embodiments, the first and second active patterns AP1 and AP2 may be part of the substrate 100, and in this manner, protruding from the substrate 100 refers to protruding past the top surface of the substrate 100. The first and second active patterns AP1 and AP2 may be formed epitaxially from the top surface of the substrate or by patterning the substrate 100.

The device isolation layer ST may not cover the upper portions of the first active patterns AP1 or the upper portions of the second active patterns AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. In an example embodiment, the first and second source/drain patterns SD1 and SD2 may have their top surfaces coplanar with those of the first and second channel patterns CH1 and CH2. In another example embodiment, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element (e.g., Si) of the substrate 100. In an example embodiment, SiGe may be an alloy with any molar ratio of silicon and germanium, i.e., with a molecular formula of the form $Si_{(1-x)}Ge_x$, where x is fractional number less than 1. The first source/drain patterns SD1 may thus provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be spaced apart from each other in the second direction D2. The gate electrodes GE may vertically overlap the first and second channel patterns CH1 and CH2. Each of the gate electrodes GE may surround the top surface and opposite sidewalls of each of the first and second channel patterns CH1 and CH2.

Referring back to FIG. 2D, the gate electrode GE may be provided on a first top surface TS1 of the first channel pattern CH1 and at least one first sidewall SW1 of the first channel pattern CH1. The gate electrode GE may be provided on a second top surface TS2 of the second channel pattern CH2 and at least one second sidewall SW2 of the second channel pattern CH2. In this sense, a transistor according to the present embodiment may be a three-dimensional field effect transistor such as a fin field-effect transistor (FinFET) in which the first and second channel patterns CH1 and CH2 are three-dimensionally surrounded by the gate electrode GE.

Referring again to FIGS. 1, 2A to 2D, and 3, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include one or more of SiCN, SiCON, and SiN. Alternatively, the gate spacers GS may include a multiple layer including two or more of SiCN, SiCON, and SiN.

A gate capping pattern GP may be provided on each of the gate electrodes GE. The gate capping pattern GP may extend in the first direction D1 along the gate electrode GE. The gate capping pattern GP may include a material having etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST below the gate electrode GE (see FIG. 2D).

In an embodiment of the present inventive concepts, the gate dielectric pattern GI may include a high-k dielectric material whose dielectric constant is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In another embodiment of the present inventive concepts, the gate dielectric pattern GI may include a ferroelectric. The gate dielectric pattern GI including the ferroelectric may serve as a negative capacitor. For example, when the ferroelectric is supplied with an external voltage, there may be the occurrence of negative capacitance effect caused by phase change, from an initial polarization state to a different polarization state, resulting from migration of dipoles in the ferroelectric. In this case, a transistor including the ferroelectric according to the present inventive concepts may have an increased overall capacitance, and accordingly may increase sub-threshold swing characteristics and may reduce operating voltage.

The ferroelectric of the gate dielectric pattern GI may include hafnium oxide doped with (or containing) one or more of zirconium (Zr), silicon (Si), aluminum (Al), and lanthanum (La). Because hafnium oxide is doped with one or more of zirconium (Zr), silicon (Si), aluminum (Al), and lanthanum (La) at a certain ratio, at least a portion of the ferroelectric may have an orthorhombic crystal structure. When at least a portion of the ferroelectric has the orthorhombic crystal structure, the negative capacitance effect may occur. The ferroelectric may have a volume ratio of 10% to 50% at its portion having the orthorhombic crystal structure.

When the ferroelectric includes zirconium-doped hafnium oxide (ZrHfO), a ratio of Zr atoms to Zr and Hf atoms, or a ratio of Zr/(Hf+Zr), may fall within a range from about 45 at % to about 55 at %. When the ferroelectric includes silicon-doped hafnium oxide (SiHfO), a ratio of silicon (Si) atoms to silicon (Si) and hafnium (Hf) atoms, or a ratio of Si/(Hf+Si), may fall within a range from about 4 at % to about 6 at %. When the ferroelectric includes aluminum-doped hafnium oxide (AlHfO), a ratio of Al atoms to Al and Hf atoms, or a ratio of Al/(Hf+Al), may fall within a range from about 5 at % to about 10 at %. When the ferroelectric includes lanthanum-doped hafnium oxide (LaHfO), a ratio of La atoms to La and Hf atoms, or a ratio of La/(Hf+La), may fall within a range from about 5 at % to about 10 at %.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal which is selected from titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include metal whose resistance is lower than that of the first metal pattern. For example, the second metal pattern may include one or more of tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 covering the gate capping patterns GP. A third interlayer dielectric layer 130 may be provided on the second interlayer dielectric layer 120. For example, the first, second, and third interlayer dielectric layers 110, 120, and 130 may include a silicon oxide layer.

Active contacts AC may be provided to penetrate the first and second interlayer dielectric layers 110 and 120 and to correspondingly have electrical connection with the first and second source/drain patterns SD1 and SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. The active contact AC, for example, may cover at least a portion of a sidewall of the gate spacer GS. Although not shown, the active contact AC may partially cover the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, one or more of titanium silicide, tantalum silicide, tungsten silicide, nickel silicide, and cobalt silicide.

The device isolation layer ST filling the second trench TR2 may be provided thereon with at least one gate contact GC that penetrates the second interlayer dielectric layer 120 and the gate capping pattern GP and has electrical connection with the gate electrode GE.

Each of the active contact AC and the gate contact GC may include a conductive pattern FM and a barrier pattern BM that surrounds the conductive pattern FM. For example, the conductive pattern FM may include one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first wiring layer may be provided in the third interlayer dielectric layer 130. The first wiring layer may include a plurality of connection lines IL and a plurality of vias VI below the connection lines IL. The connection lines IL may extend in parallel to each other along the second direction D2. The connection lines IL may be arranged in the first direction D1.

The via VI may be provided between the active contact AC and a first connection line of the connection lines IL. The first connection line may be electrically connected through the via VI to the active contact AC. The via VI may be provided between the gate contact GC and a second connection line of the connection lines IL. The second connection line may be electrically connected through the via VI to the gate contact GC.

Although not shown, the first wiring layer may be provided with a plurality of stacked wiring layers. Logic cells may be connected to each other through the connection lines IL and via VI, thereby constituting a logic circuit.

The first source/drain pattern SD1 will be further discussed in detail with reference back to FIGS. 2A, 2C, and 3. A recess RS may be formed on the upper portion of the first active pattern AP1. The recess RS may be formed between a pair of adjacent first channel patterns CH1. The first source/drain pattern SD1 may be provided in the recess RS.

The first source/drain pattern SD1 may include a buffer layer BL, a main layer ML on the buffer layer BL, and a capping layer CL on the main layer ML. In an embodiment of the present inventive concepts, the buffer layer BL may include first and second semiconductor layers SL1 and SL2. The main layer ML may include third and fourth semiconductor layers SL3 and SL4. The capping layer CL may include a fifth semiconductor layer SL5. In another embodiment of the present inventive concepts, the buffer layer BL may be composed of one semiconductor layer. The main layer ML may be composed of one semiconductor layer.

Referring back to FIG. 3, the first source/drain pattern SD1 will be described based on its cross-section in the second direction D2. The recess RS may include a pair of inner sidewalls RSw and a bottom RSb between the pair of inner sidewalls RSw. The inner sidewall RSw may have a first inner sidewall IS1 at an upper portion the recess RS and a second inner sidewall IS2 that extends from the first inner sidewall IS1 toward the bottom RSb.

The first inner sidewall IS1 may diagonally extend from a top surface AP1t of the first active pattern AP1 toward the first channel pattern CH1. The first inner sidewall IS1 may have a first angle θ1 relative to a bottom surface of the substrate 100. For example, the first angle θ1 may range from about 30° to about 70°. A length of about 5 nm to about 10 nm may be provided as a first depth TK1 from the top surface AP1t (e.g., top surface of a fin) of the first active pattern AP1 to a first level LV1 below the first inner sidewall IS1.

The second inner sidewall IS2 may extend downwards in a near-vertical direction from the first inner sidewall IS1. The second inner sidewall IS2 may have a curved surface. An upper portion of the second inner sidewall IS2 may have a second angle θ2 relative to the bottom surface of the substrate 100. The second angle θ2 may be measured at a second level LV2 positioned at a second depth TK2 from the top surface AP1t (or top surface of a fin) of the first active pattern AP1. The second dept TK2 may be about 15 nm. The second angle θ2 may be greater the first angle θ1. The second angle θ2 may range from about 70° to about 90°. In an example embodiment, at the first level LV1, the sidewall of the recess may be divided into the first inner sidewall IS1 and the second sidewall IS2. The first level LV1 may be defined as a boundary at which a sidewall slope angle of the recess may change from the first angle θ1 to the second angle θ2.

The buffer layer BL may cover the inner sidewall RSw and the bottom RSb of the recess RS. The buffer layer BL may cover the second inner sidewall IS2 of the recess RS, but may not cover the first inner sidewall IS1 of the recess RS. The present invention is not limited thereto. In an example embodiment, the buffer layer BL may not cover at least a portion of the first inner sidewall IS1. The buffer layer BL may expose at least a portion of the first inner sidewall IS1.

The buffer layer BL may have a U shape when viewed in a cross-section taken along the second direction D2. For example, the buffer layer BL may include a side part SIP, extending upwardly along the second inner sidewall IS1 in the recess, on the inner sidewall RSw of the recess RS and a central part CEP, covering the bottom RSb of the recess, on the bottom RSb of the recess RS. The central part CEP of the buffer layer BL may have a top end at a first height H1, and the side part SIP of the buffer layer BL may have a top end at a second height H2. The second height H2 may be higher than the first height H1. The first and second heights H1 and H2 may be measured from a reference such as the lowest part of the bottom RSb of the recess RS. A top end of the buffer layer BL may be at a lower level than that of the top surface AP1t of the first active pattern AP1. For example, the top end of the buffer layer BL may be at the second level LV2.

The main layer ML may be provided on the buffer layer BL, thereby covering an inner sidewall of the main layer ML. The main layer ML may fill the recess RS. The main layer ML may directly cover the first inner sidewall IS1 of the recess RS, which first inner sidewall IS1 is not covered with the buffer layer BL. The main layer ML may directly cover the first inner sidewall IS1 of the recess RS, which first inner sidewall IS1 is exposed by the buffer layer BL. The main layer ML may have a top surface that is substantially coplanar with or lower than the top surface AP1t of the first active pattern AP1.

The capping layer CL may be provided on the main layer ML. The capping layer CL may cover an exposed surface of the main layer ML. The capping layer CL may be conformally formed on the exposed surface of the main layer ML. The capping layer CL may protect the main layer ML.

Each of the buffer layer BL and the main layer ML may include a semiconductor element whose lattice constant is greater than that of a semiconductor element of the substrate 100. For example, when the substrate 100 includes silicon (Si), the buffer layer BL and the main layer ML may include silicon-germanium (SiGe). Germanium (Ge) may have a lattice constant greater than that of silicon (Si).

The buffer layer BL may contain germanium (Ge) whose concentration is relatively low. For example, the first semiconductor layer SL1 of the buffer layer BL may contain germanium (Ge) whose concentration ranges about 15 at % to about 25 at %. The second semiconductor layer SL2 of the buffer layer BL may contain germanium (Ge) whose concentration is greater than that of germanium (Ge) contained in the first semiconductor layer SL1. The second semiconductor layer SL2 may have a germanium concentration of about 25 at % to about 75 at %. In an example embodiment, the buffer layer BL may have a germanium concentration of about 10 at % to about 45 at %. The germanium concentration of the buffer layer BL may increase along a third direction D3.

The main layer ML may contain germanium (Ge) whose concentration is relatively high compared to the buffer layer BL. For example, the third semiconductor layer SL3 of the main layer ML may have a germanium concentration of about 50 at % to about 60 at %. The fourth semiconductor layer SL4 of the main layer ML may have a germanium concentration greater than that of the third semiconductor layer SL3. The germanium concentration of the fourth semiconductor layer SL4 may range from about 55 at % to about 70 at %. In conclusion, the main layer ML may have a germanium concentration of about 50 at % to about 70 at %. The germanium concentration of the main layer ML may increase along the third direction D3.

The buffer layer BL and the main layer ML may include impurities (e.g., boron) that cause the first source/drain pattern SD1 to have a p-type conductivity. The main layer ML may have an impurity concentration (e.g., atomic percent) greater than that of the buffer layer BL.

The buffer layer BL may prevent stacking faults between the main layer ML and the substrate 100 (or the first active pattern AP1). The occurrence of stacking faults may increase channel resistance. The stacking faults may most frequently occur on the bottom RSb of the recess RS. Therefore, to prevent the stacking faults, the central part CEP of the buffer layer BL may be formed to have a third thickness T3 greater than a certain value. When a thickness of the buffer layer BL becomes increased to prevent the stacking faults, the main layer ML may have a reduced volume in the recess RS. A reduction in volume of the main layer ML may reduce performance (e.g., resistance of source/drains) of PMOSFET.

According to some embodiments of the present inventive concepts, the buffer layer BL may have the third thickness T3 greater than a certain value on the bottom RSb of the recess RS, and thus may prevent the stacking faults. Furthermore, the buffer layer BL may have a fourth thickness T4, which is less than the third thickness T3, at its side part SIP on the inner sidewall RSw of the recess RS. For example, the buffer layer BL is not formed on the first inner sidewall IS1 of the recess RS. The main layer ML may securely have a volume greater than a certain value in the recess RS.

Consequently, according to some embodiments of the present inventive concepts, the stacking faults may be prevented to reduce channel resistance of PMOSFET, and further a volume of the main layer ML may be sufficiently obtained to increase performance of PMOSFET.

The fifth semiconductor layer SL5 of the capping layer CL may include the same semiconductor element as that of the substrate 100. For example, the fifth semiconductor layer SL5 may include single-crystalline silicon (Si). The fifth semiconductor layer SL5 may have a silicon concentration of about 95 at % to about 100 at %. The fifth semiconductor layer SL5 may have a germanium concentration of about 0 at % to about 5 at %. Germanium (Ge) contained in the fourth semiconductor layer SL4 may diffuse into the fifth semiconductor layer SL5, and as a result, the fifth semiconductor layer SL5 may contain germanium (Ge) whose amount is extremely small (e.g., equal to or less than about 5 at %).

The first semiconductor layer SL1 on the bottom RSb of the recess RS may have a first thickness T1 less than a second thickness T2 of the second semiconductor layer SL2 on the bottom RSb of the recess RS. As discussed above, the central part CEP of the buffer layer BL may have the third thickness T3. The third thickness T3 may be a sum of the first thickness T1 and the second thickness T2.

As previously mentioned, the side part SIP of the buffer layer BL may have the fourth thickness T4 in the second direction D2. The fourth thickness T4 may be measured at a third level LV3 positioned at a third depth TK3 from the top surface AP1t (or top surface of a fin) of the first active pattern AP1. The third dept TK3 may be about 20 nm. At the third level LV3, the first source/drain pattern SD1 may have a maximum width in the second direction D2. The fourth thickness T4 may be less than the third thickness T3. A ratio of the fourth thickness T4 to the third thickness T3, or a ratio of T4/T3, may range from about 0.3 to about 0.7.

Referring back to FIG. 2C, the first source/drain pattern SD1 will be described based on its cross-section in the first direction D1. The buffer layer BL may be provided on each of the first active patterns AP1. The buffer layer BL on a first one of the first active patterns AP1 may have a top surface at a fourth level LV4. The buffer layer BL on a second one of the first active patterns AP1 may have a top surface at a fifth level LV5. The buffer layer BL on a third one of the first active patterns AP1 may have a top surface at the fourth level LV4. The fifth level LV5 may be lower than the fourth level LV4. In such cases, the buffer layer BL on the second one of the first active patterns AP1 may have a height (or vertical length) less than that of the buffer layer BL on the first one of the first active patterns AP1. The height (or vertical length) of the buffer layer BL on the second one of the first active patterns AP1 may be less than that of the buffer layer BL on the third one of the first active patterns AP1.

The main layer ML may be provided on the first active patterns AP1. For example, the main layers ML provided on corresponding first active patterns AP1 may be integrally merged to form a single main layer ML on the first active patterns AP1.

The main layer ML may include a first facet FA1, a second facet FA2, a third facet FA3, and a fourth facet FA4. The first to fourth facets FA1 to FA4 may be surfaces of the third semiconductor layer SL3. The first to fourth facets FA1 to FA4 may have crystal planes in the same crystallographic space group such as {111} planes.

A sharp edge SE of the main layer ML may be defined by the first and second facets FA1 and FA2 or by the third and fourth facets FA3 and FA4. For example, the sharp edge SE may be a line formed where the first and second facets FA1 and FA2 meet each other or the third and fourth facets FA3 and FA4. The sharp edge SE may horizontally extend in a direction crossing a longitudinal direction (i.e., the second direction D2) of the first active pattern AP1. For example, the sharp edge SE may extend parallel to the second direction D2.

The capping layer CL may be provided on the main layer ML. The capping layer CL may cover the first to fourth facets FA1 to FA4 of the main layer ML. The capping layer CL may cover the sharp edge SE of the main layer ML. The first source/drain pattern SD1 may have a maximum width in the first direction D1 at a level at which is located the sharp edge SE of the main layer ML.

The active contact AC and the silicide pattern SC may be provided on the first source/drain pattern SD1. In this case, the silicide pattern SC may be in contact not only with the top surface of the main layer ML but with a top surface of the capping layer CL. For example, the capping layer CL may increase a contact area between the first source/drain pattern SD1 and the silicide pattern SC. The increase in contact area may be caused by a contact area between the silicide pattern SC and the main and capping layers ML and CL that is greater than that between the silicide pattern SC and the main layer ML.

Figure 7A:
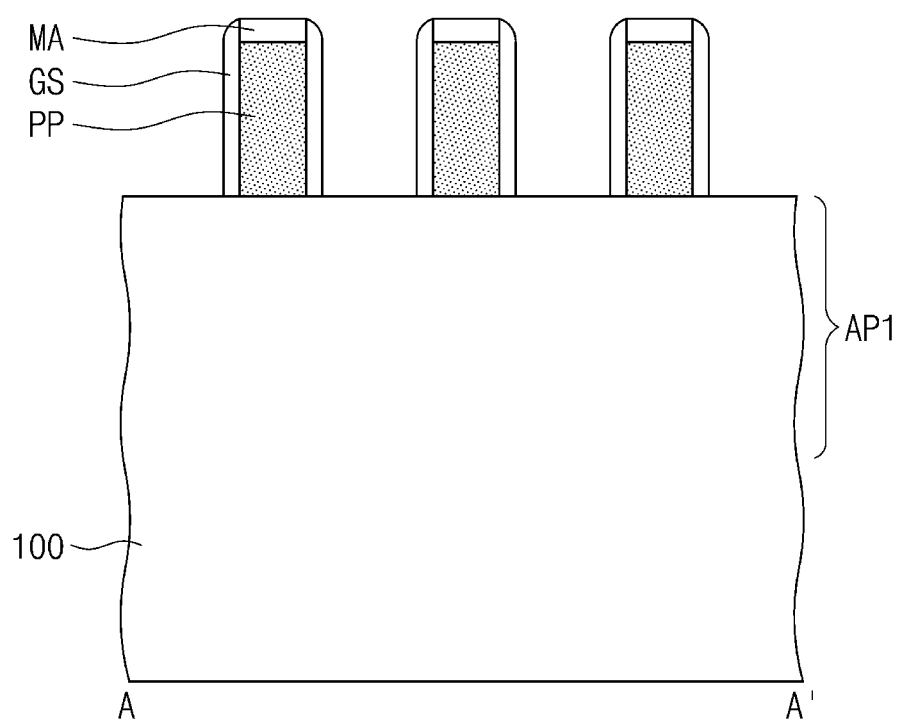
Figure 7A:
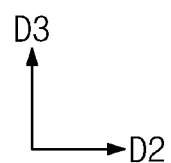
Figure 7B:
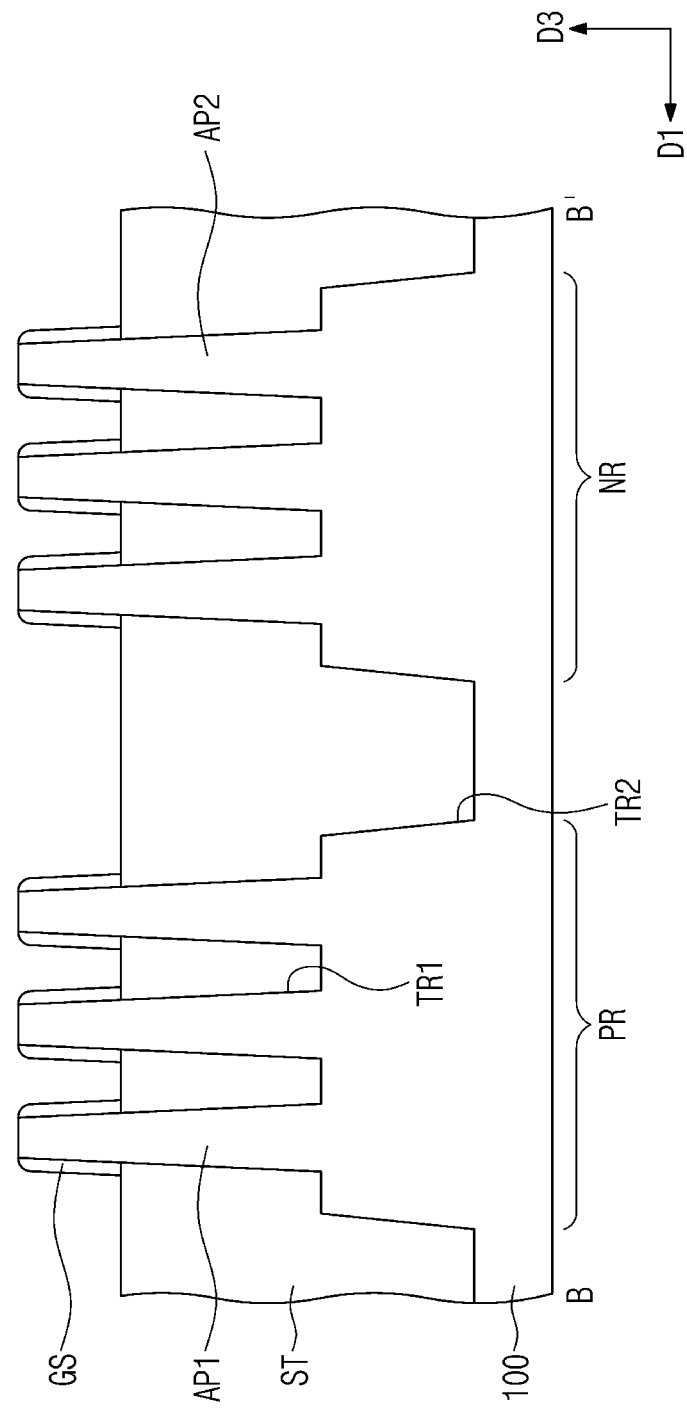
FIGS. 7B, 9B, and 11B illustrate cross-sectional views taken along line B-B' of FIGS. 6, 8, and 10, respectively.
Figure 7C:
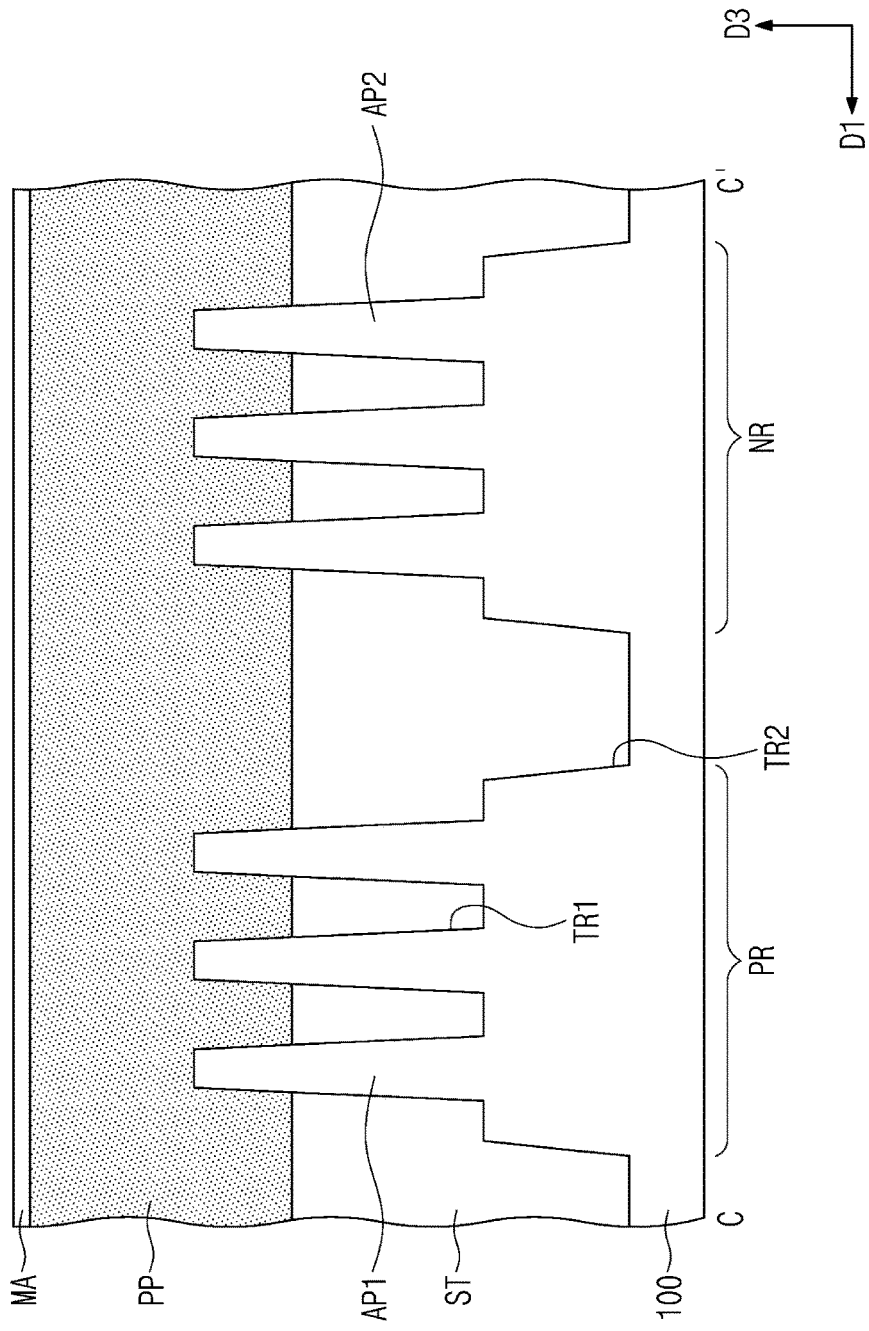
FIGS. 7C, 9C, and 11C illustrate cross-sectional views taken along line C-C' of FIGS. 6, 8, and 10, respectively.
Figure 8:
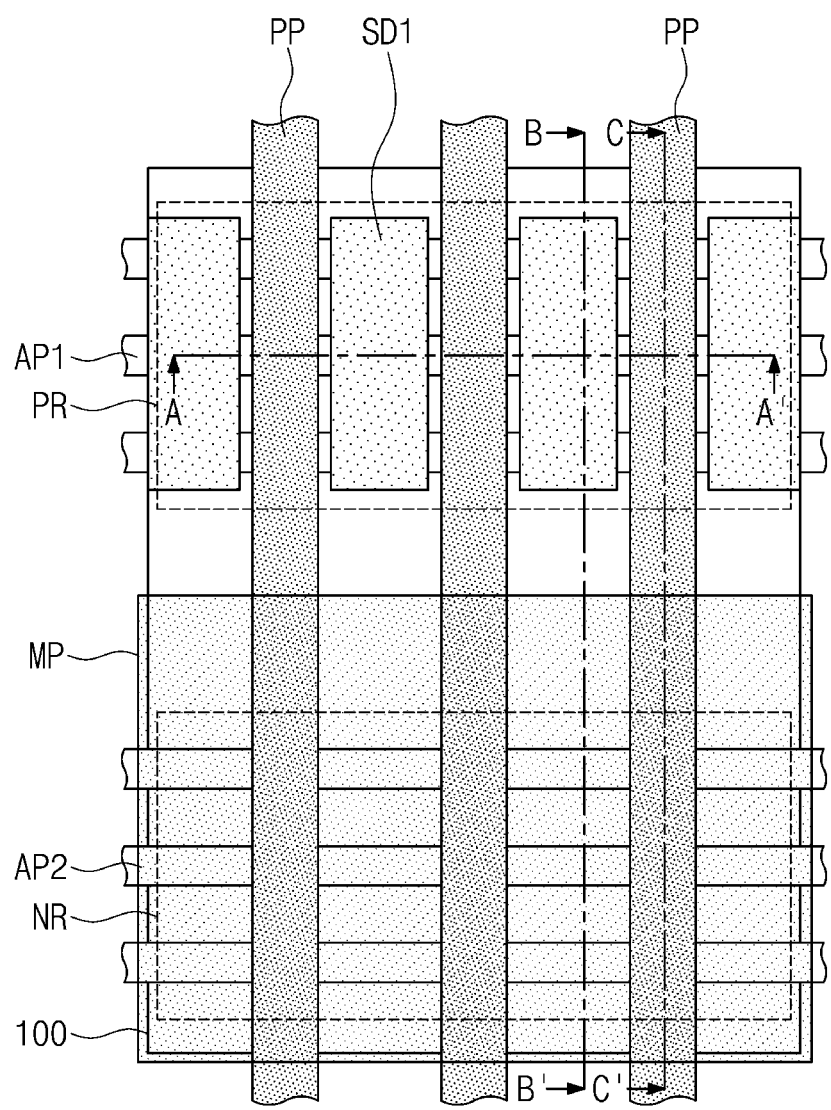
Figure 8:
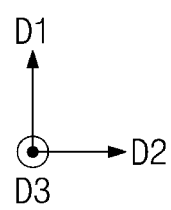
Figure 9A:
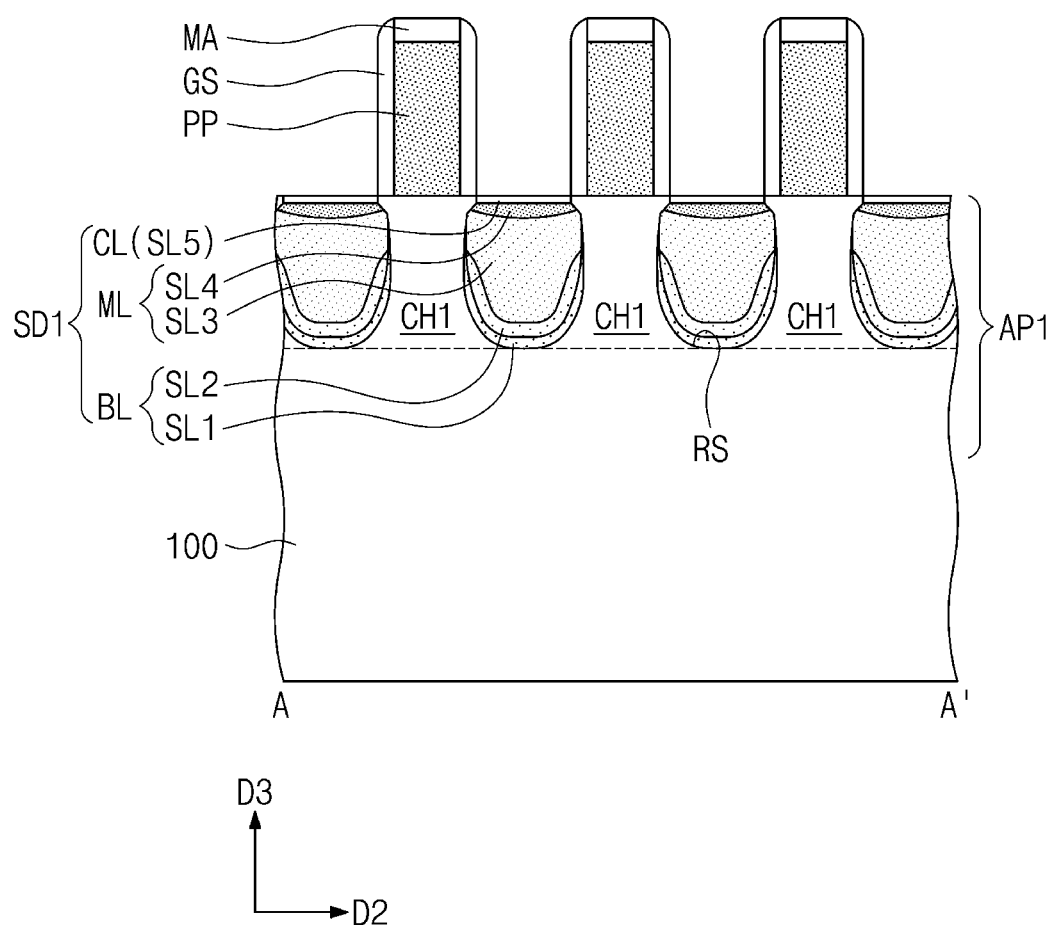
Figure 9B:
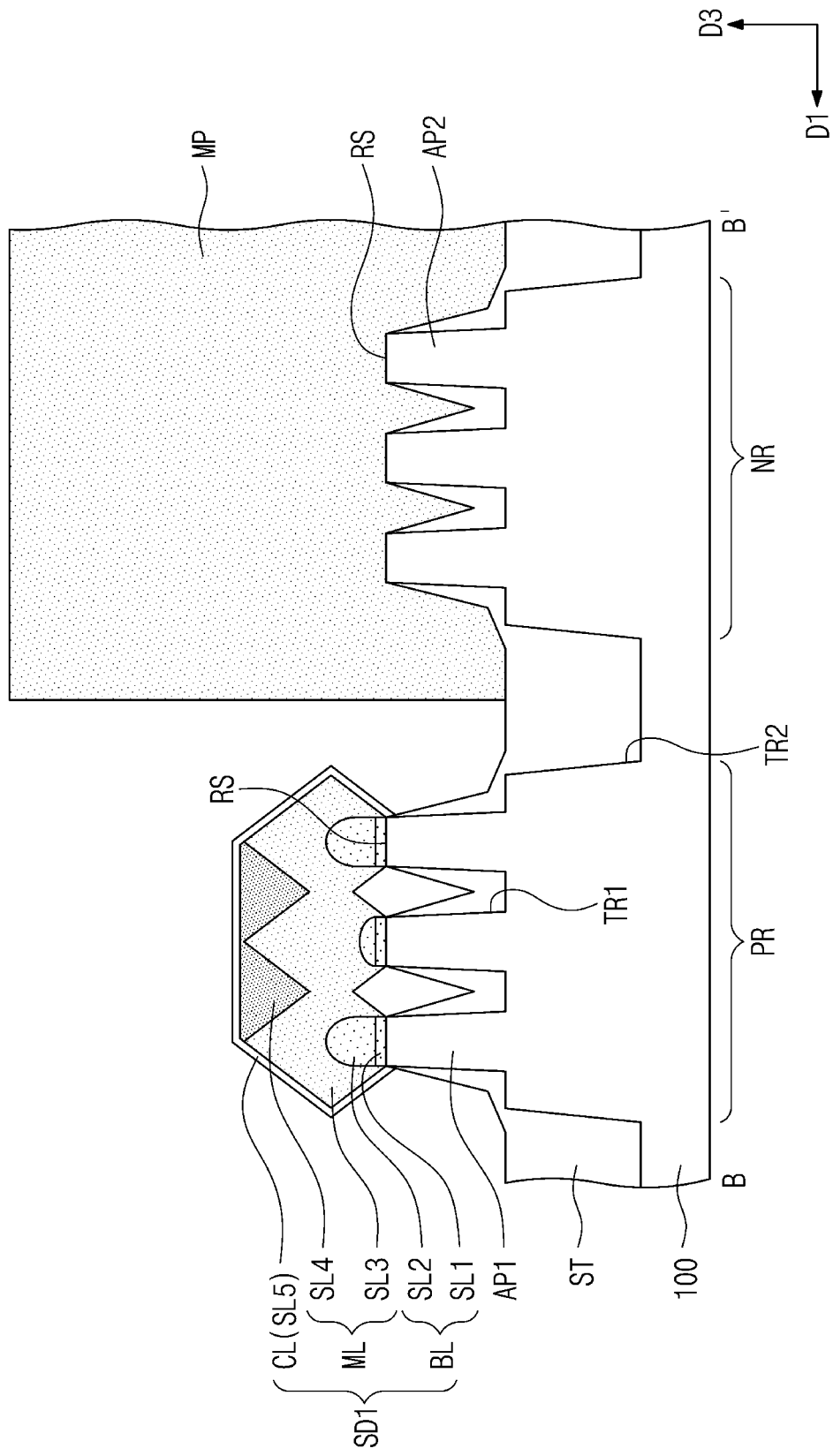
Figure 9C:
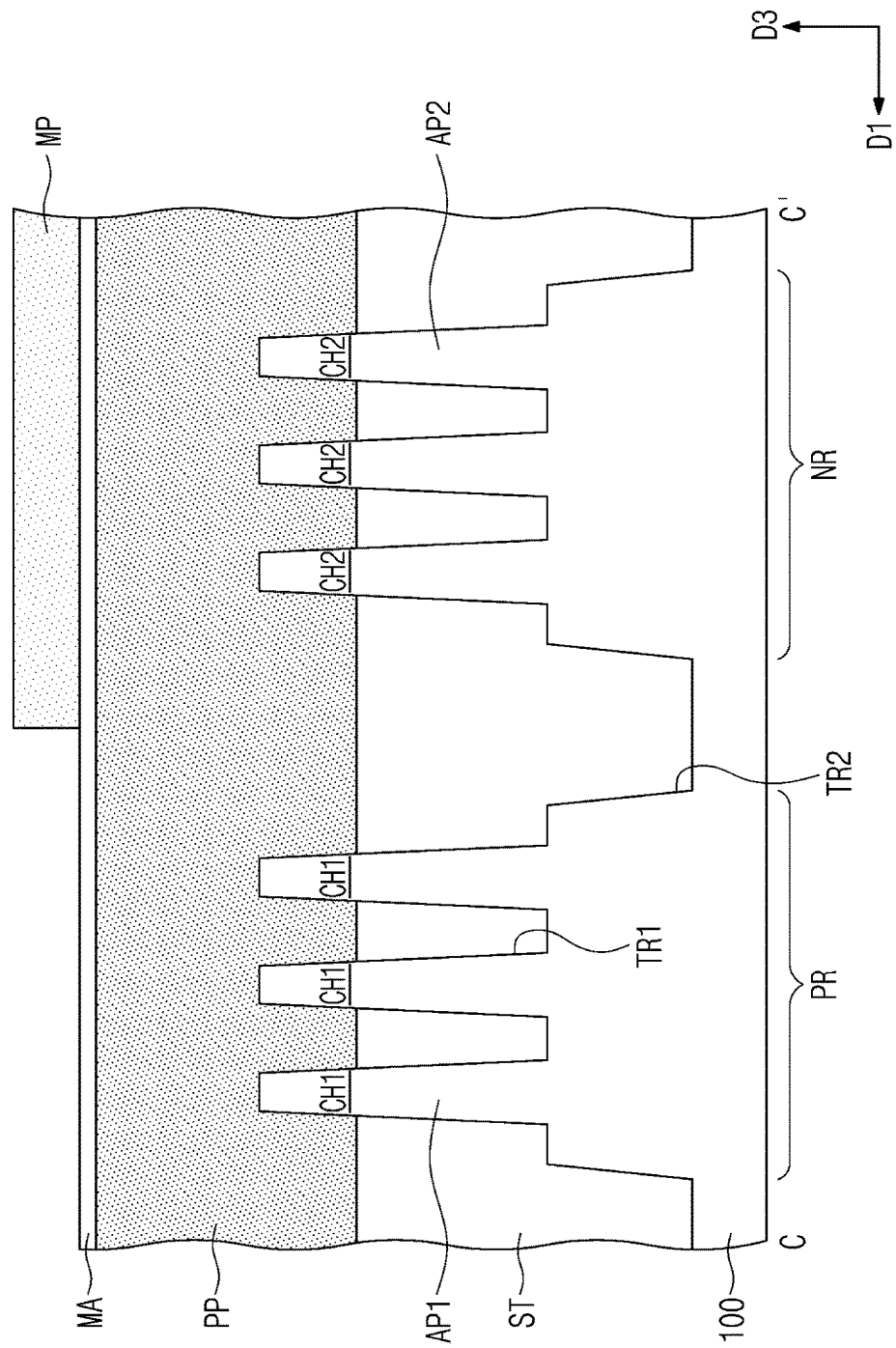
Figure 10:
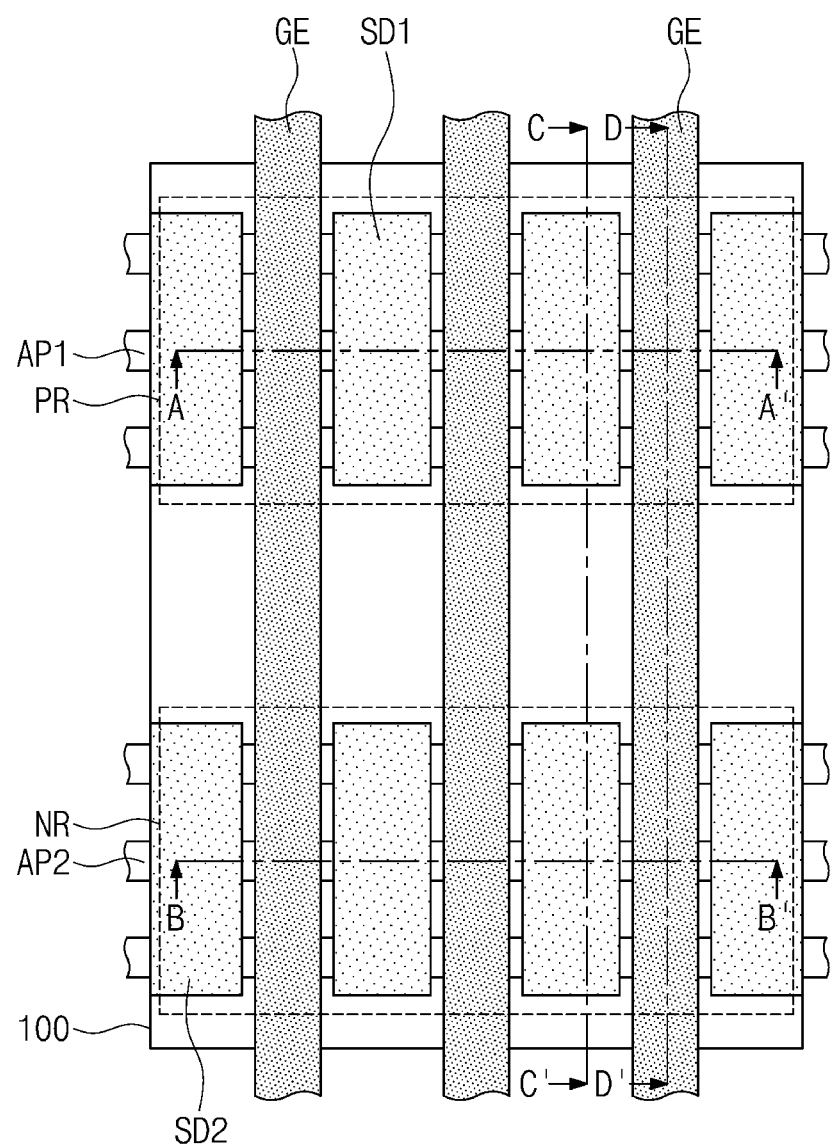
Figure 11A:
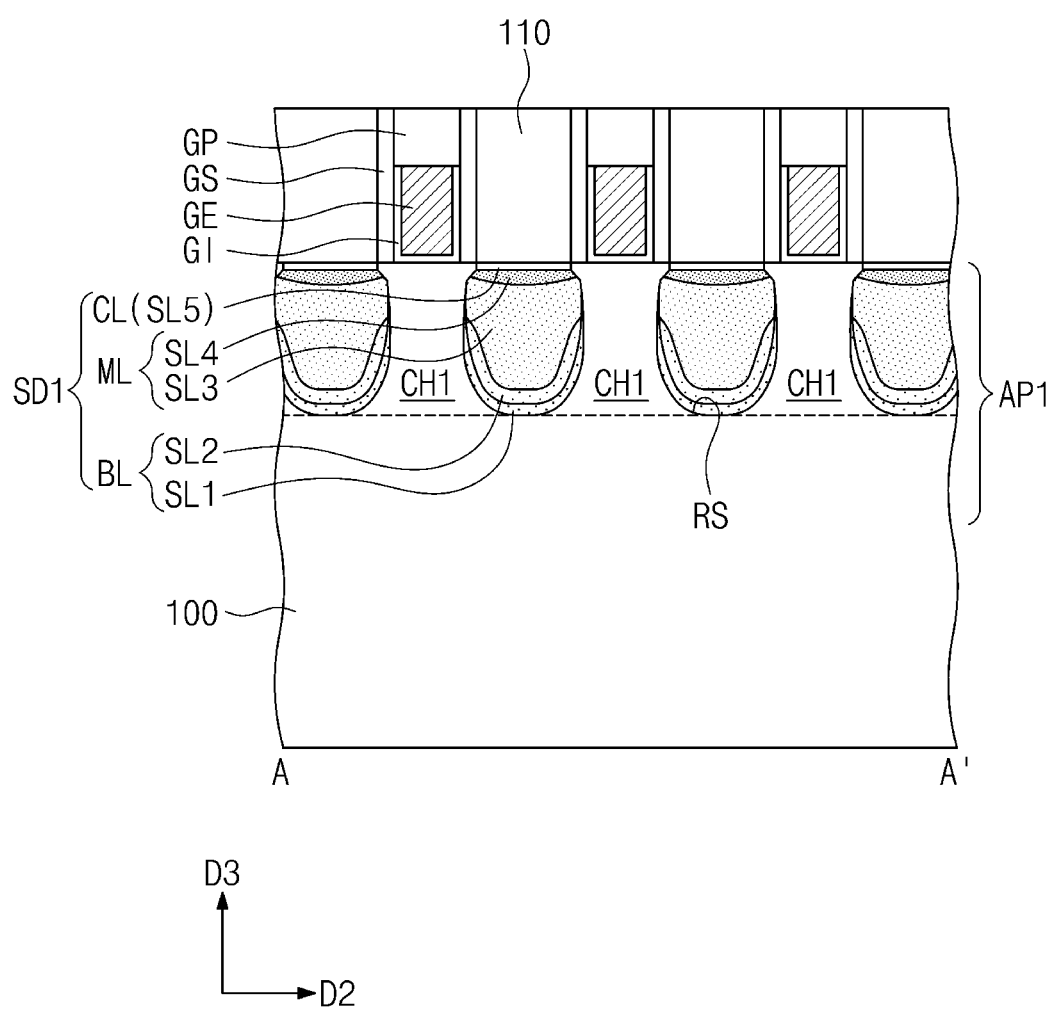
Figure 11B:
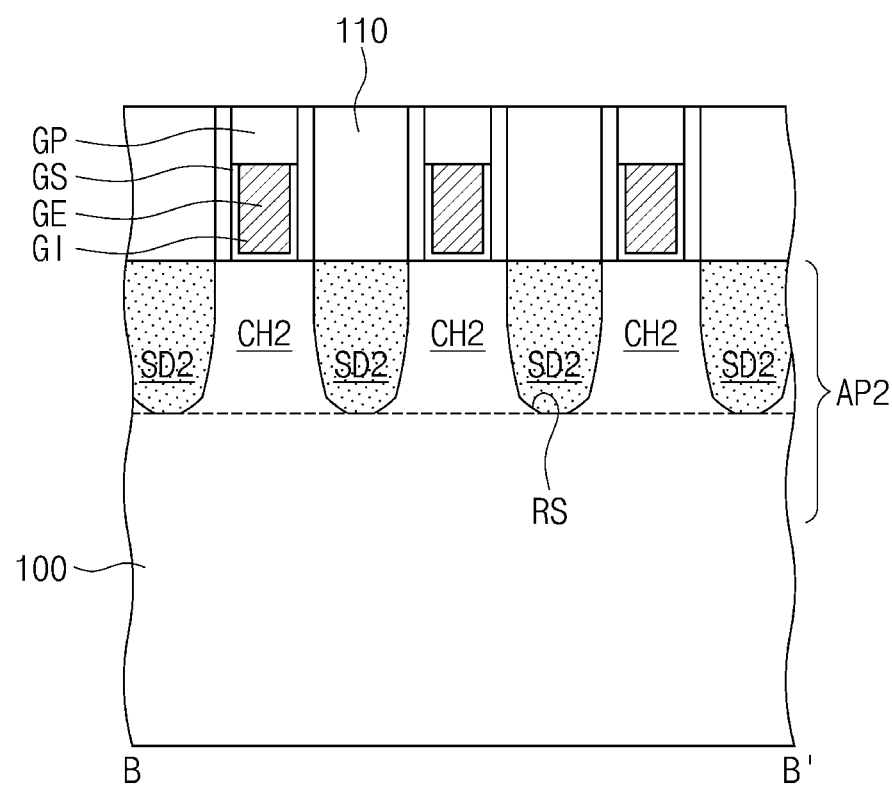
Figure 11C:
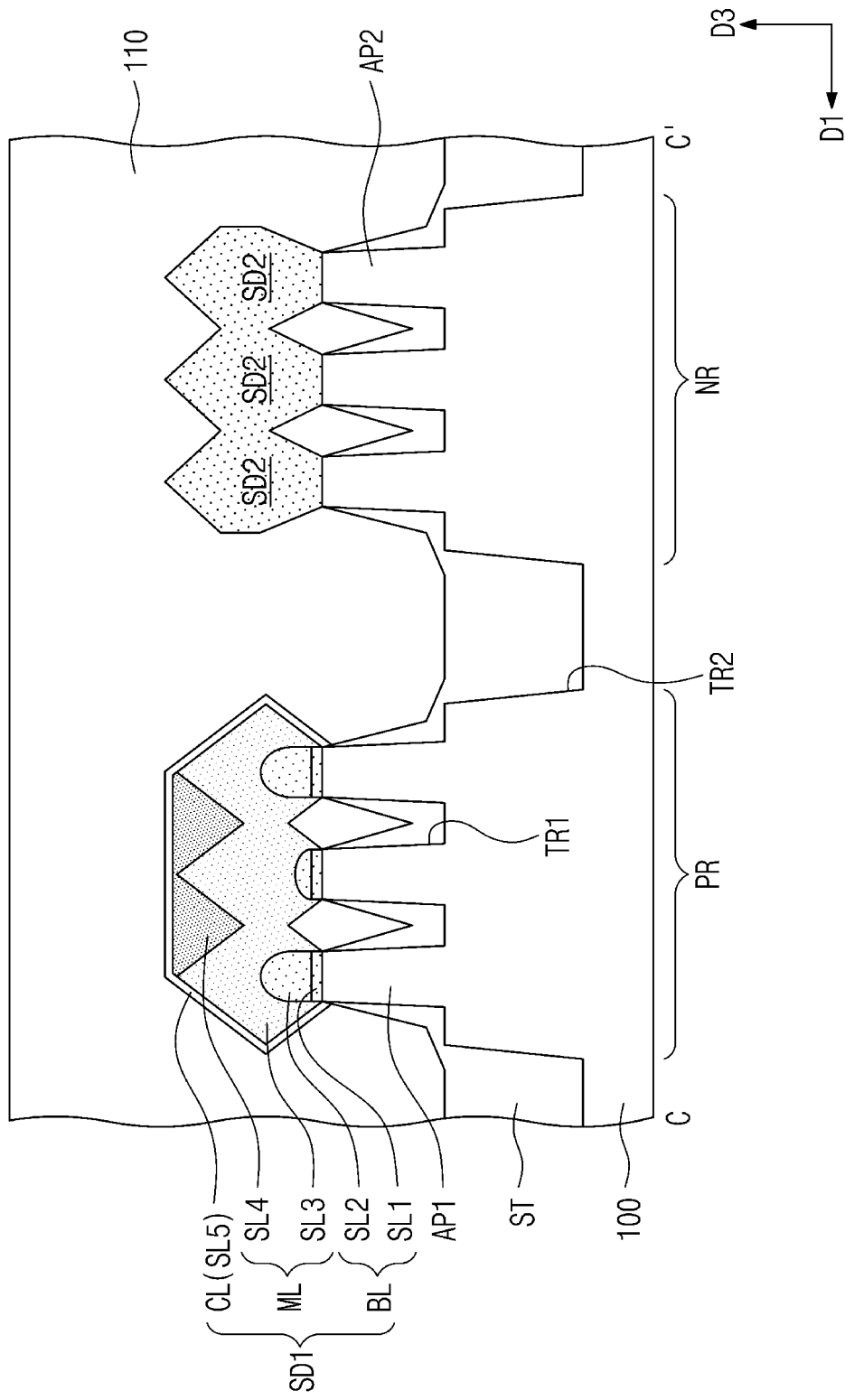
Figure 11D:
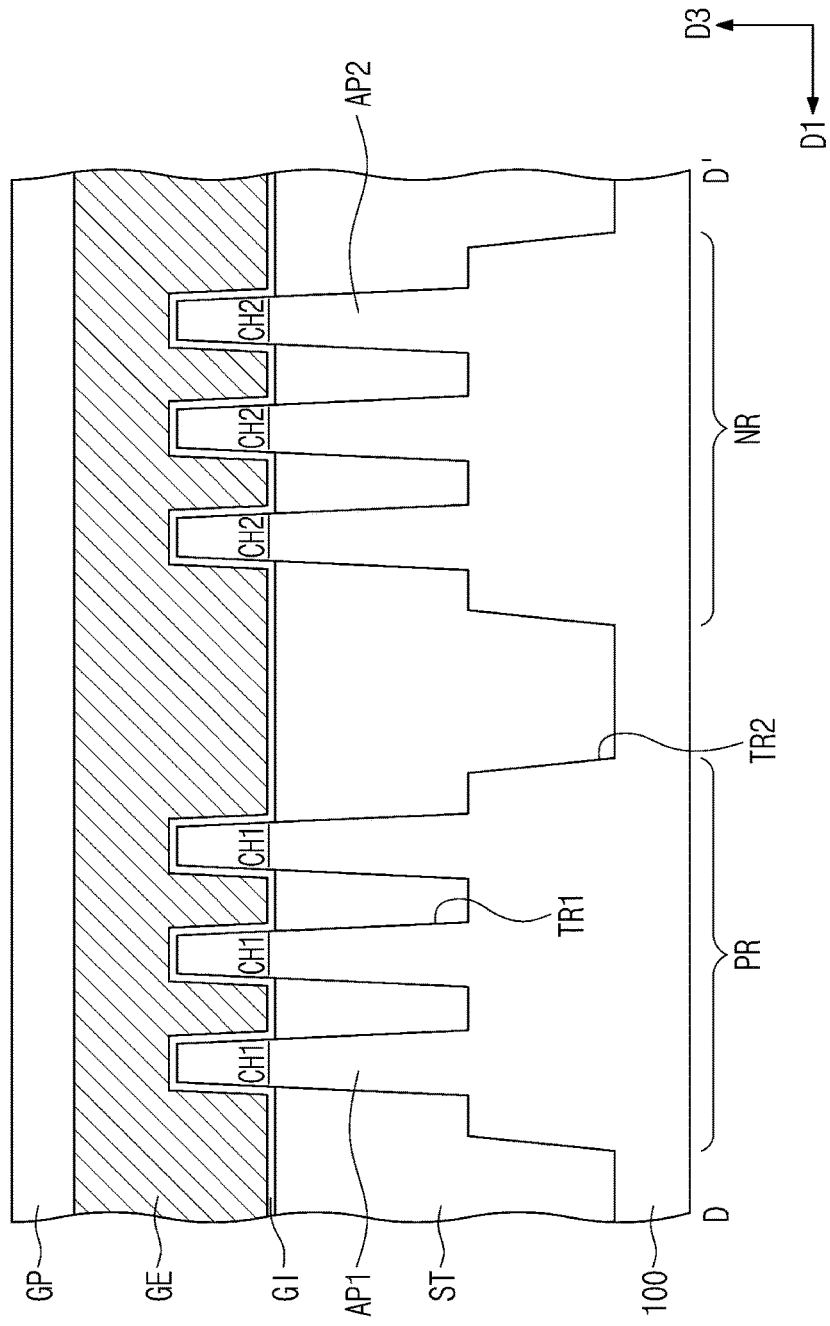
FIG. 11D illustrates a cross-sectional view taken along line D-D' of FIG. 10.

FIGS. 4, 6, 8, and 10 illustrate plan views showing a method of fabricating a semiconductor device according to some example embodiments of the present inventive concepts. FIGS. 5, 7A, 9A, and 11A illustrate cross-sectional views taken along line A-A' of FIGS. 4, 6, 8, and 10, respectively. FIGS. 7B, 9B, and 11B illustrate cross-sectional views taken along line B-B' of FIGS. 6, 8, and 10, respectively. FIGS. 7C, 9C, and 11C illustrate cross-sectional views taken along line C-C' of FIGS. 6, 8, and 10, respectively. FIG. 11D illustrates a cross-sectional view taken along line D-D' of FIG. 10.

Figure 4:
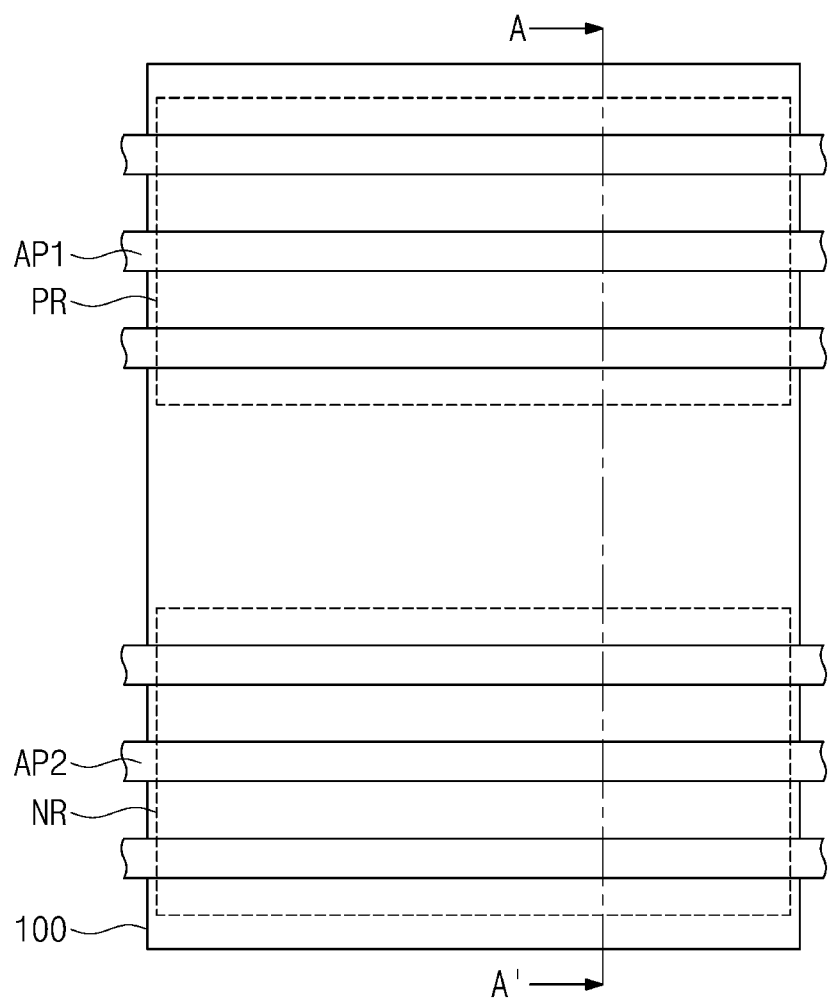
FIGS. 4, 6, 8, and 10 illustrate plan views showing a method of fabricating a semiconductor device according to some example embodiments of the present inventive concepts.
Figure 5:
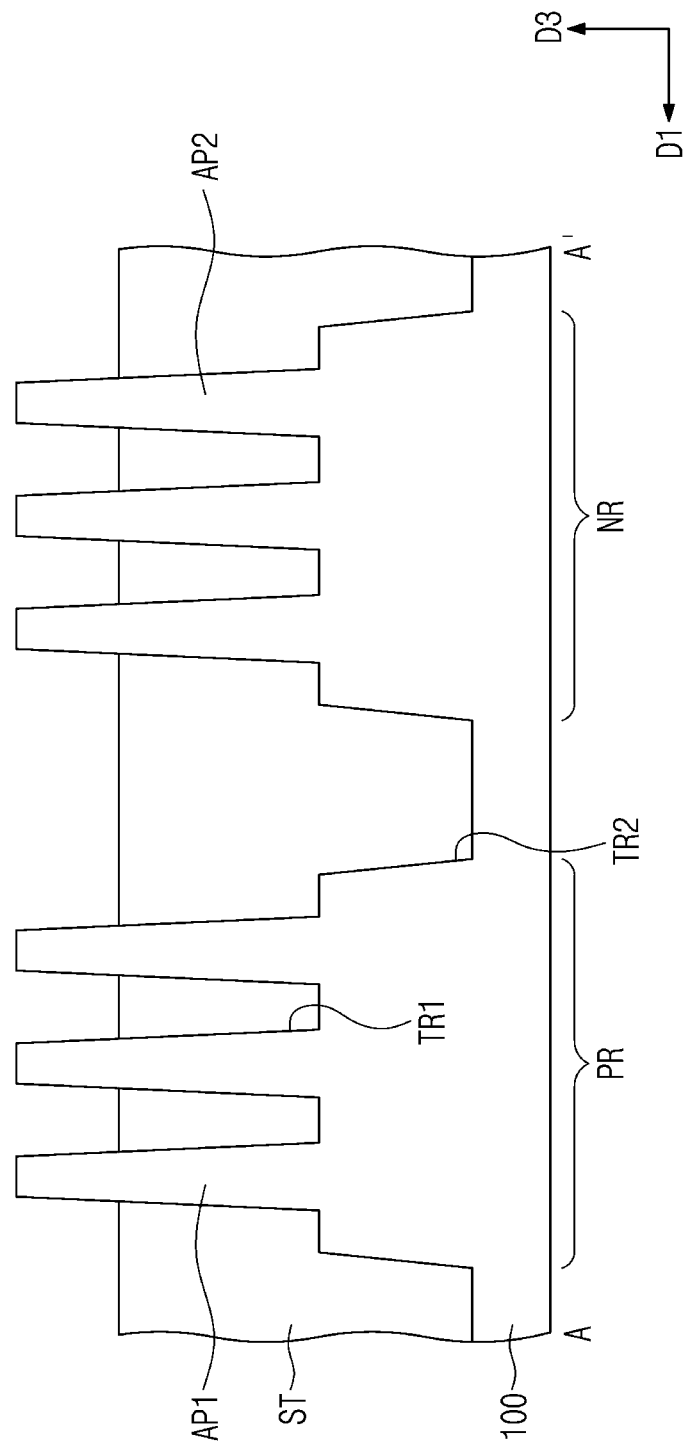
FIGS. 5, 7A, 9A, and 11A illustrate cross-sectional views taken along line A-A' of FIGS. 4, 6, 8, and 10, respectively.
Figure 6:
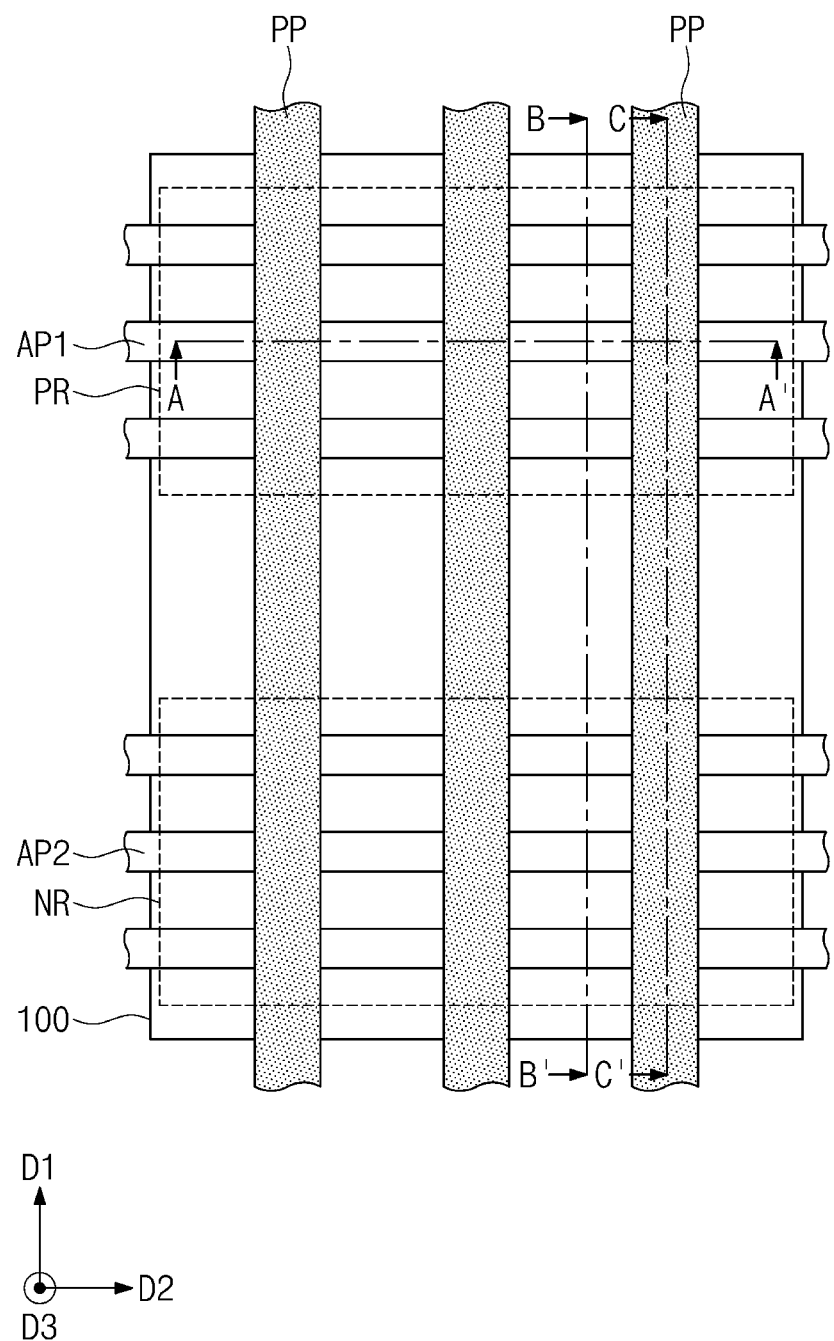

Referring to FIGS. 4 and 5, a substrate 100 may be provided which includes a first active region PR and a second active region NR. The substrate 100 may be patterned to form first and second active patterns AP1 and AP2. The present invention is not limited thereto. In an example embodiment, the first and second active patterns AP1 and AP2 may be epitaxially formed on the substrate 100. The first active patterns AP1 may be formed on the first active region PR, and the second active patterns AP2 may be formed on the second active region NR. A first trench TR1 may be formed between the first active patterns AP1 and between the second active patterns AP2.

The substrate 100 may be patterned to form a second trench TR2 between the first active region PR and the second active region NR. The second trench TR2 may be formed deeper than the first trench TR1.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first and second active patterns AP1 and AP2 are exposed. Thus, the upper portions of the first and second active patterns AP1 and AP2 may protrude vertically upwards from the device isolation layer ST.

Referring to FIGS. 6 and 7A to 7C, sacrificial patterns PP may be formed to run across the first and second active patterns AP1 and AP2. Each of the sacrificial patterns PP may be formed to have a linear or bar shape that extends in a first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include a polysilicon layer.

A pair of gate spacers GS may be formed on opposite sidewalls of each of the sacrificial patterns PP. The gate spacers GS may also be formed on opposite sidewalls of each of the first and second active patterns AP1 and AP2. The opposite sidewalls of each of the first and second active patterns AP1 and AP2 may be exposed portions that are covered neither with the device isolation layer ST nor with the sacrificial patterns PP.

The formation of the gate spacers GS may include conformally forming a gate spacer layer on the entire surface of the substrate 100 and anisotropically etching the gate spacer layer. The gate spacer layer may include one or more of SiCN, SiCON, and SiN. Alternatively, the gate spacer layer may be a multiple layer including two or more of SiCN, SiCON, and SiN.

Referring to FIGS. 8 and 9A to 9C, recesses RS may be formed on the upper portions of the first and second active patterns AP1 and AP2. A pair of recesses RS may be formed on opposite sides of each of the sacrificial patterns PP. The formation of the recesses RS may include performing an etching process in which the hardmask patterns MA and the gate spacers GS are used as an etching mask to etch the upper portions of the first and second active patterns AP1 and AP2. When the etching process is performed, the gate spacers GS may be removed from the opposite sidewalls of each of the first and second active patterns AP1 and AP2. An exposed device isolation layer ST may be recessed during the etching process.

A first mask layer MP may be formed to selectively cover the second active patterns AP2. The first mask layer MP may selectively cover the second active region NR, but may expose the first active region PR. The first mask layer MP may expose the first active patterns AP1.

First source/drain patterns SD1 may be formed to fill the recesses RS on the first active patterns AP1 exposed by the first mask layer MP. For example, the formation of the first source/drain patterns SD1 may include performing a selective epitaxial growth process in which inner sidewalls of the recesses RS are used as seed layers. When the first source/drain patterns SD1 are formed, a first channel pattern CH1 may be defined between a pair of first source/drain patterns SD1. For example, the selective epitaxial growth process may include a chemical vapor deposition (CVD) process or a molecular beam epitaxy (MBE) process.

The first source/drain pattern SD1 may include a second semiconductor element whose lattice constant is greater than that of a first semiconductor element included of substrate 100. For example, the first semiconductor element may be silicon (Si), and the second semiconductor element may be germanium (Ge). The first source/drain pattern SD1 may be formed of a plurality of semiconductor layers. The formation of the first source/drain pattern SD1 may include forming first to fifth semiconductor layers SL1 to SL5 that are sequentially stacked. The first and second semiconductor layers SL1 and SL2 may constitute a buffer layer BL, the third and fourth semiconductor layers SL3 and SL4 may constitute a main layer ML, and the fifth semiconductor layer SL5 may constitute a capping layer CL.

The buffer layer BL may be formed by a first selective epitaxial growth process in which the inner sidewall of the recess RS on the first active pattern AP1 is used as a seed layer. The buffer layer BL may contain the second semiconductor element whose concentration is low. The buffer layer BL may be doped to include low-concentrated impurities. For example, the buffer layer BL may include silicon-germanium (SiGe) doped with boron (B). The buffer layer BL may have a germanium concentration of about 10 at % to about 45 at %.

Referring back to FIG. 3, the buffer layer BL may be formed to cover the inner sidewall RSw and the bottom RSb of the recess RS. The buffer layer BL may not cover at least a portion of the first inner sidewall IS1, but may expose at least the portion of the first inner sidewall IS1. During the first selective epitaxial growth process, a source gas may be provided to grow the buffer layer BL, and an etching gas may also be provided to suppress the growth of the buffer layer BL. The etching gas may include HCl, $Cl_2$, or a combination thereof. A process condition (e.g., temperature, pressure, and flow rate of the etching gas) of the first selective epitaxial growth process may be controlled to allow the buffer layer BL to grow without covering the first inner sidewall IS1 of the recess RS.

The main layer ML may be formed by a second selective epitaxial growth process in which the buffer layer BL is used as a seed layer. The main layer ML may contain the second semiconductor element whose concentration is high. The second semiconductor element contained in the main layer ML may have a concentration greater than that of the second semiconductor element contained in the buffer layer BL. The main layer ML may be doped to include impurities whose concentration is higher than that of impurities included in the buffer layer BL. For example, the main layer ML may include silicon-germanium (SiGe) doped with boron (B). The main layer ML may have a germanium concentration of about 50 at % to about 70 at %. Referring again to FIG. 3, the main layer ML may be formed to directly cover the first inner sidewall IS1 of the recess RS. The first inner sidewall IS1 thereof is exposed by the buffer layer BL.

The capping layer CL may be formed by a third selective epitaxial growth process in which the main layer ML is used as a seed layer. The capping layer CL may be formed to conformally cover a surface of the main layer ML. The capping layer CL may include the same first semiconductor element as that of the substrate 100. For example, the capping layer CL may include single-crystalline silicon (Si). The capping layer CL may have a silicon concentration of about 95 at % to about 100 at %. In an embodiment, the third selective epitaxial growth process may be performed at a lower temperature than those of the first and second selective epitaxial growth processes.

Referring to FIGS. 10 and 11A to 11D, the first mask layer MP may be removed. A second mask layer may be formed to selectively cover the first active patterns AP1. The second mask layer may selectively cover the first active region PR, but may expose the second active region NR. The second mask layer may expose the second active patterns AP2.

Second source/drain patterns SD2 may be formed to fill the recesses RS on the second active patterns AP2 exposed by the second mask layer. For example, the formation of the second source/drain patterns SD2 may include performing a selective epitaxial growth process in which exposed inner sidewalls of the recesses RS are used as seed layers. The second source/drain patterns SD2 may contain the same first semiconductor element, such as silicon (Si), as that of the substrate 100. Thereafter, the second mask layer may be removed.

A first interlayer dielectric layer 110 may be formed to cover the first and second source/drain patterns SD1 and SD2, the gate spacers GS, and the mask patterns MA. For example, the first interlayer dielectric layer 110 may include a silicon oxide layer.

A planarization process may be performed on the first interlayer dielectric layer 110 until top surfaces of the sacrificial patterns PP are exposed. An etch-back or chemical mechanical polishing (CMP) process may be employed to planarize the first interlayer dielectric layer 110. As a result, the first interlayer dielectric layer 110 may have a top surface substantially coplanar with those of the sacrificial patterns PP and those of the gate spacers GS.

Each of the sacrificial patterns PP may be replaced with a gate electrode GE and a gate dielectric pattern GI. For example, the exposed sacrificial patterns PP may be selectively removed. The gate dielectric pattern GI may be formed in an empty space where the sacrificial pattern PP is removed. The gate electrode GE may be formed on the gate dielectric pattern GI, filling the empty space.

The gate dielectric pattern GI may be conformally formed by an atomic layer deposition (ALD) process and/or a chemical oxidation process. The gate dielectric pattern GI may include, for example, a high-k dielectric material. Alternatively, the gate dielectric pattern GI may include a ferroelectric.

The formation of the gate electrode GE may include forming a gate electrode layer on the gate dielectric pattern GI and planarizing the gate electrode layer. For example, the gate electrode layer may include a first gate electrode layer including metal nitride and a second gate electrode layer including low-resistance metal.

An upper portion of the gate electrode GE may be selectively etched to recess the gate electrode GE. The recessed gate electrode GE may have a top surface lower than that of the first interlayer dielectric layer 110 and those of the gate spacers GS. A gate capping pattern GP may be formed on the recessed gate electrode GE. The formation of the gate capping pattern GP may include forming a gate capping layer that covers the recessed gate electrode GE and planarizing the gate capping layer until the top surface of the first interlayer dielectric layer 110 is exposed. The gate capping layer may include, for example, one or more of SiON, SiCN, SiCON, and SiN.

Referring back to FIGS. 1 and 2A to 2D, the second interlayer dielectric layer 120 may be formed on the first interlayer dielectric layer 110. The active contacts AC may be formed to penetrate the second and first interlayer dielectric layers 120 and 110 and to have electrical connection with the first and second source/drain patterns SD1 and SD2. The gate contact GC may be formed to penetrate the second interlayer dielectric layer 120 and the gate capping pattern GP and to have electrical connection with the gate electrode GE. The formation of the active contacts AC and the gate contact GC may include forming the barrier pattern BM that fills the contact hole and forming the conductive pattern FM on the barrier pattern BM.

The silicide pattern SC may be formed between the active contact AC and the first source/drain pattern SD1 and between the active contact AC and the second source/drain pattern SD2. The formation of the silicide pattern SC may include performing a silicidation process on the first and second source/drain patterns SD1 and SD2. For example, the silicide pattern SC may include one or more of titanium silicide, tantalum silicide, tungsten silicide, nickel silicide, and cobalt silicide.

The third interlayer dielectric layer 130 may be formed on the second interlayer dielectric layer 120. The first wiring layer may be formed in the third interlayer dielectric layer 130. The formation of the first wiring layer may include forming the plurality of connection lines IL and forming the plurality of vias VI below the connection lines IL. The connection lines IL and the vias VI may be formed by employing a damascene process or a dual damascene process.

Figure 12:
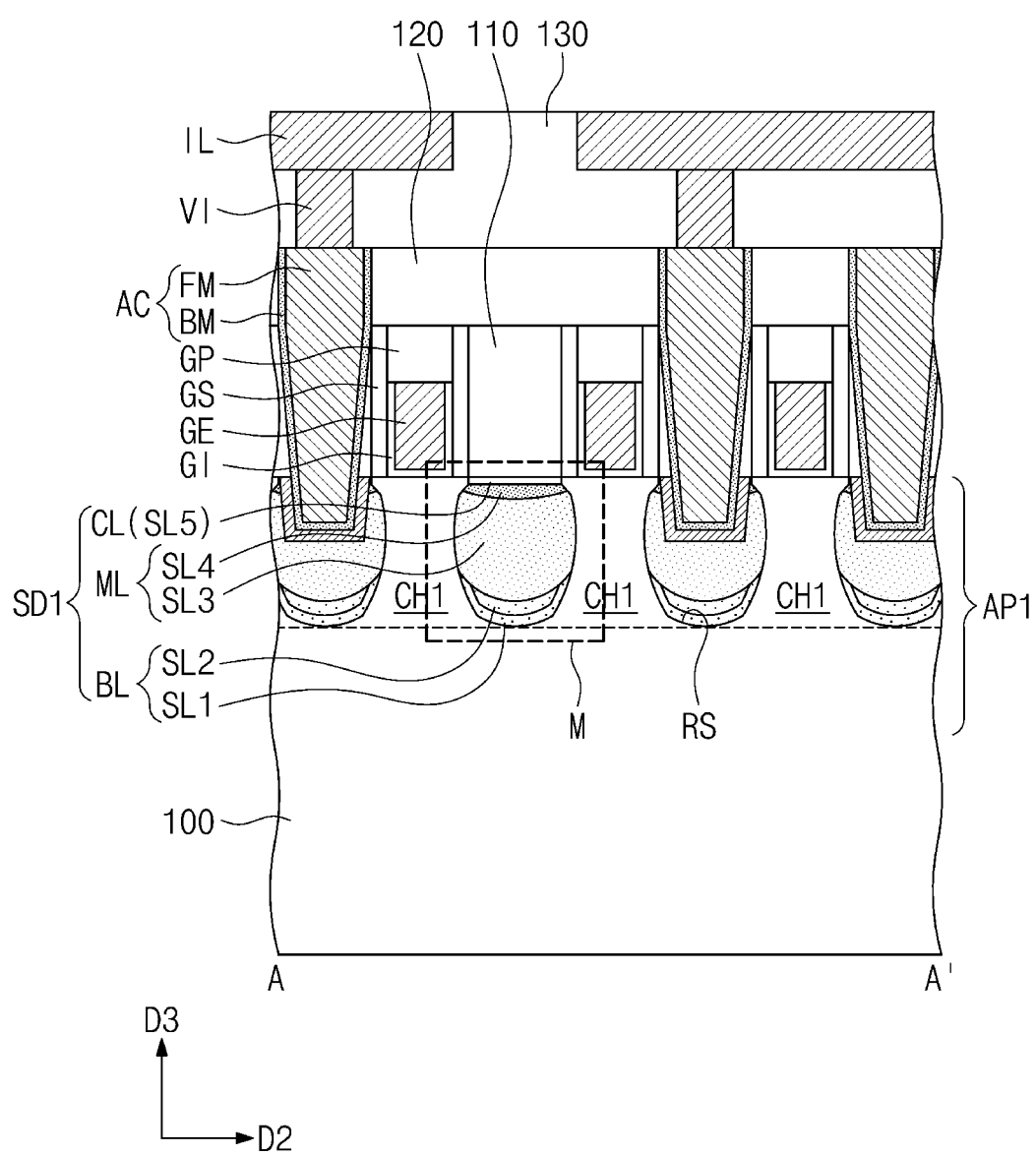
FIG. 12 illustrates a cross-sectional view taken along line A-A' of FIG. 1, showing a semiconductor device according to some example embodiments of the present inventive concepts.
Figure 13:
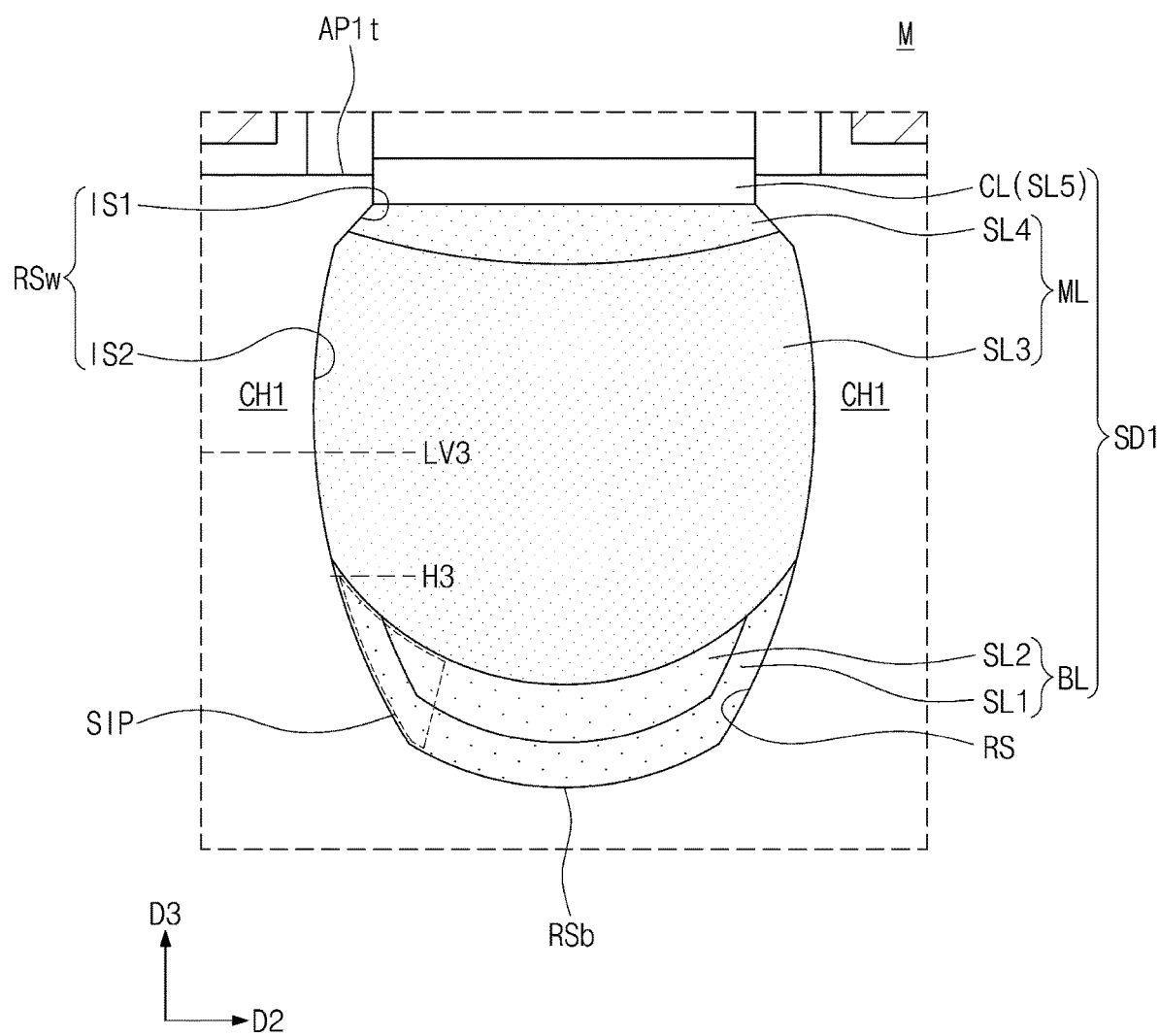
FIG. 13 illustrates an enlarged cross-sectional view showing section M of FIG. 12.

FIG. 12 illustrates a cross-sectional view taken along line A-A' of FIG. 1, showing a semiconductor device according to some example embodiments of the present inventive concepts. FIG. 13 illustrates an enlarged cross-sectional view showing section M of FIG. 12. In the embodiment that follows, a detailed description of technical features repetitive to those discussed above with reference to FIGS. 1, 2A to 2D, and 3 will be omitted, and a difference thereof will be discussed in detail.

Referring to FIGS. 1, 2B to 2D, 12, and 13, the buffer layer BL of the first source/drain pattern SD1 may cover a portion of the second inner sidewall IS2 of the recess RS. The buffer layer BL may not cover at least a portion of the second inner sidewall IS2 of the recess RS, but may expose the at least a portion of the second inner sidewall IS2. The buffer layer BL may not cover the first inner sidewall IS1 of the recess RS. The main layer ML may directly cover the first inner sidewall IS1 of the recess RS and also directly cover at least a portion of the second inner sidewall IS2 of the recess RS. The main layer ML may cover the first inner sidewall IS1 and at least the portion of the second inner sidewall IS2 which are not covered with the buffer layer BL.

The buffer layer BL may not exist at the third level LV3 at which the first source/drain pattern SD1 has a maximum width in the second direction D2. For example, a ratio of the fourth thickness T4 to the third thickness T3 discussed above in FIG. 3 may be zero. The side part SIP of the buffer layer BL on the second inner sidewall IS2 may have a top end at a third height H3. The third height H3 may be lower than the third level LV3.

According to some embodiments of the present inventive concepts, because the buffer layer BL is selectively formed in a lower portion of the recess RS, the main layer ML may have a relatively large volume. As a result, PMOSFETs may increase in performance.

FIGS. 14A, 14B, 14C, and 14D illustrate cross-sectional views respectively taken along lines A-A', B-B', C-C', and D-D' of FIG. 1, showing a semiconductor device according to some example embodiments of the present inventive concepts. In the embodiment that follows, a detailed description of technical features repetitive to those formerly discussed with reference to FIGS. 1, 2A to 2D, and 3 will be omitted, and a difference thereof will be discussed in detail.

Referring to FIGS. 1 and 14A to 14D, the substrate 100 may be provided which includes a first active region PR and a second active region NR. A device isolation layer ST may be provided on the substrate 100. The device isolation layer ST may define the first active patterns AP1 and second active patterns AP2 on an upper portion of the substrate 100. The first active patterns AP1 and the second active patterns AP2 may be respectively defined on the first active region PR and the second active region NR.

Each of the first active patterns AP1 may be provided thereon with first channel patterns CH1 that are vertically stacked. The first channel patterns CH1 stacked on the first active pattern AP1 may be spaced apart from each other in a third direction D3. The first channel patterns CH1 stacked on the first active pattern AP1 may vertically overlap each other.

Each of the second active patterns AP2 may be provided thereon with second channel patterns CH2 that are vertically stacked. The second channel patterns CH2 stacked on the second active pattern AP2 may be spaced apart from each other in the third direction D3. The second channel patterns CH2 stacked on the second active pattern AP2 may vertically overlap each other. The first and second channel patterns CH1 and CH2 may include one or more of silicon (Si), germanium (Ge), and silicon-germanium (SiGe).

The first source/drain patterns SD1 may be provided on each of the first active patterns AP1. Recesses RS may be formed on the first active pattern AP1, and the first source/drain patterns SD1 may fill corresponding recesses RS on the first active pattern AP1. The stacked first channel patterns CH1 may be interposed between a pair of adjacent first source/drain patterns SD1. The stacked first channel patterns CH1 may connect the pair of adjacent first source/drain patterns SD1. A description of the first source/drain patterns SD1 according to the present embodiment may be substantially the same as that discussed above with reference to FIGS. 1, 2A to 2D, and 3.

The second source/drain patterns SD2 may be provided on each of the second active patterns AP2. Recesses RS may be formed on the second active pattern AP2, and the second source/drain patterns SD2 may fill corresponding recesses RS on the second active pattern AP2. The stacked second channel patterns CH2 may be interposed between a pair of adjacent second source/drain patterns SD2. The stacked second channel patterns CH2 may connect the pair of adjacent second source/drain patterns SD2.

The gate electrodes GE may be provided to extend in a first direction D1, while running across the first and second channel patterns CH1 and CH2. The gate electrode GE may vertically overlap the first and second channel patterns CH1 and CH2. A pair of gate spacers GS may be disposed on opposite sidewalls of each of the gate electrodes GE. A gate capping pattern GP may be provided on the gate electrode GE.

Figure 14A:
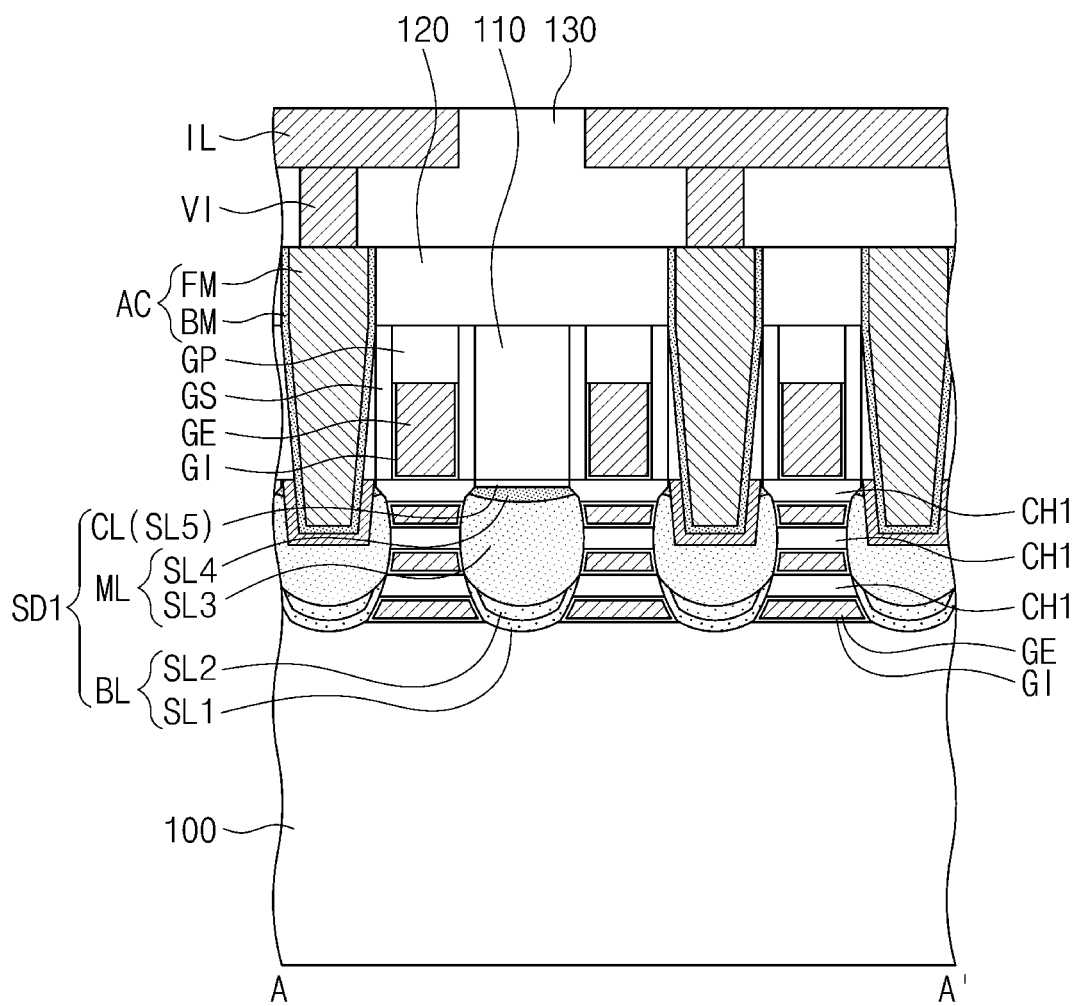
FIGS. 14A, 14B, 14C, and 14D illustrate cross-sectional views respectively taken along lines A-A', B-B', C-C', and D-D' of FIG. 1, showing a semiconductor device according to some example embodiments of the present inventive concepts.
Figure 14B:
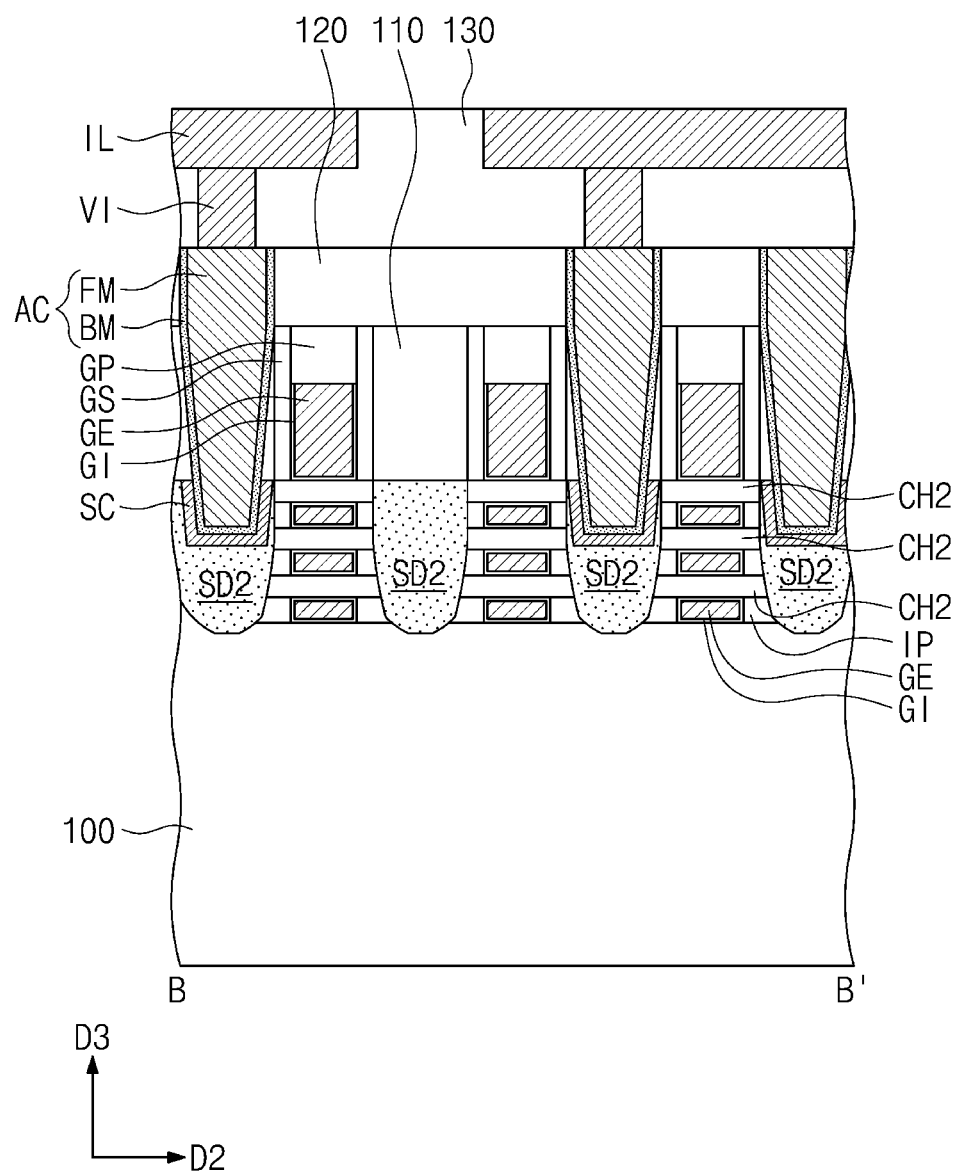
Figure 14C:
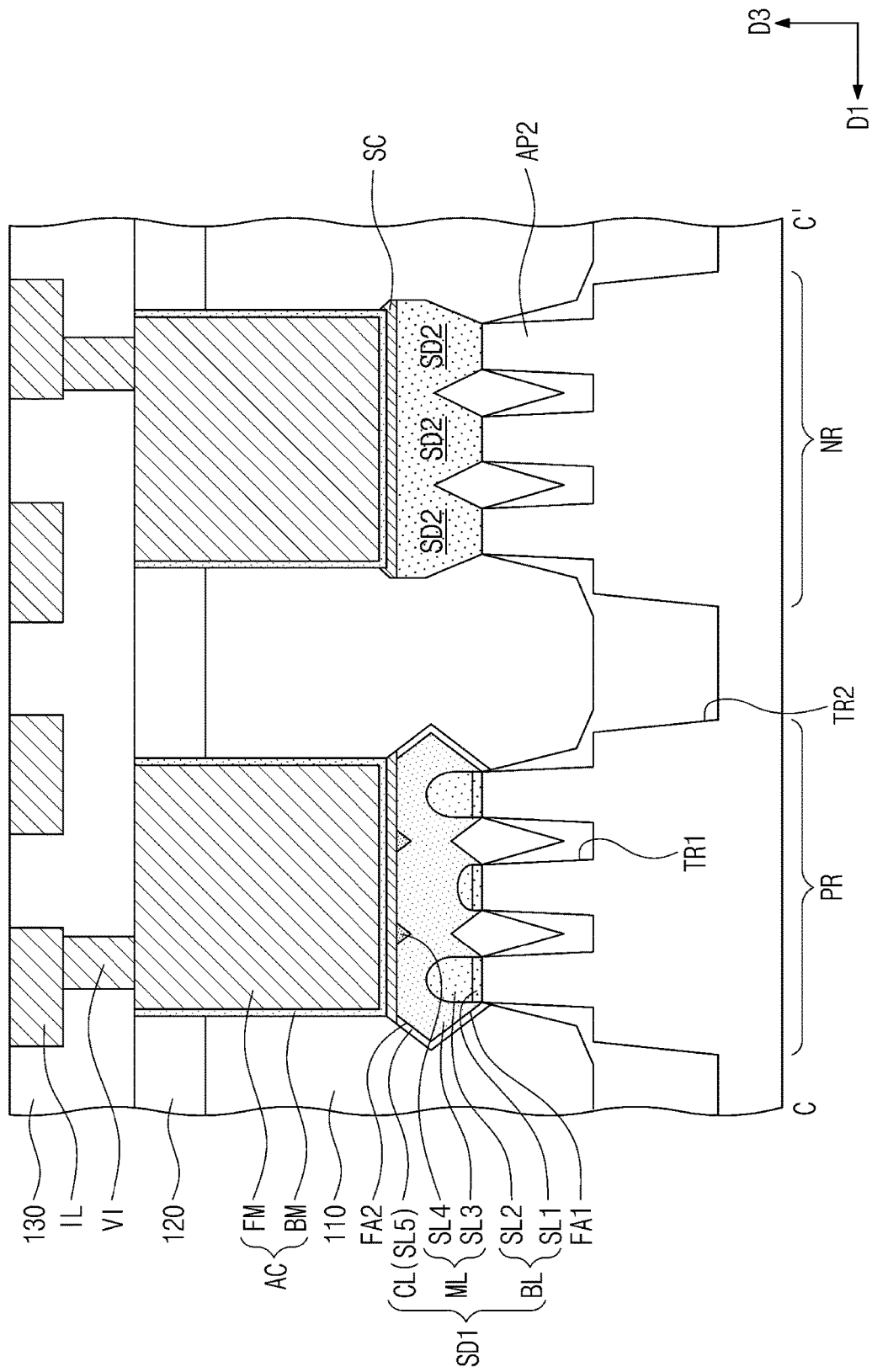
Figure 14D:
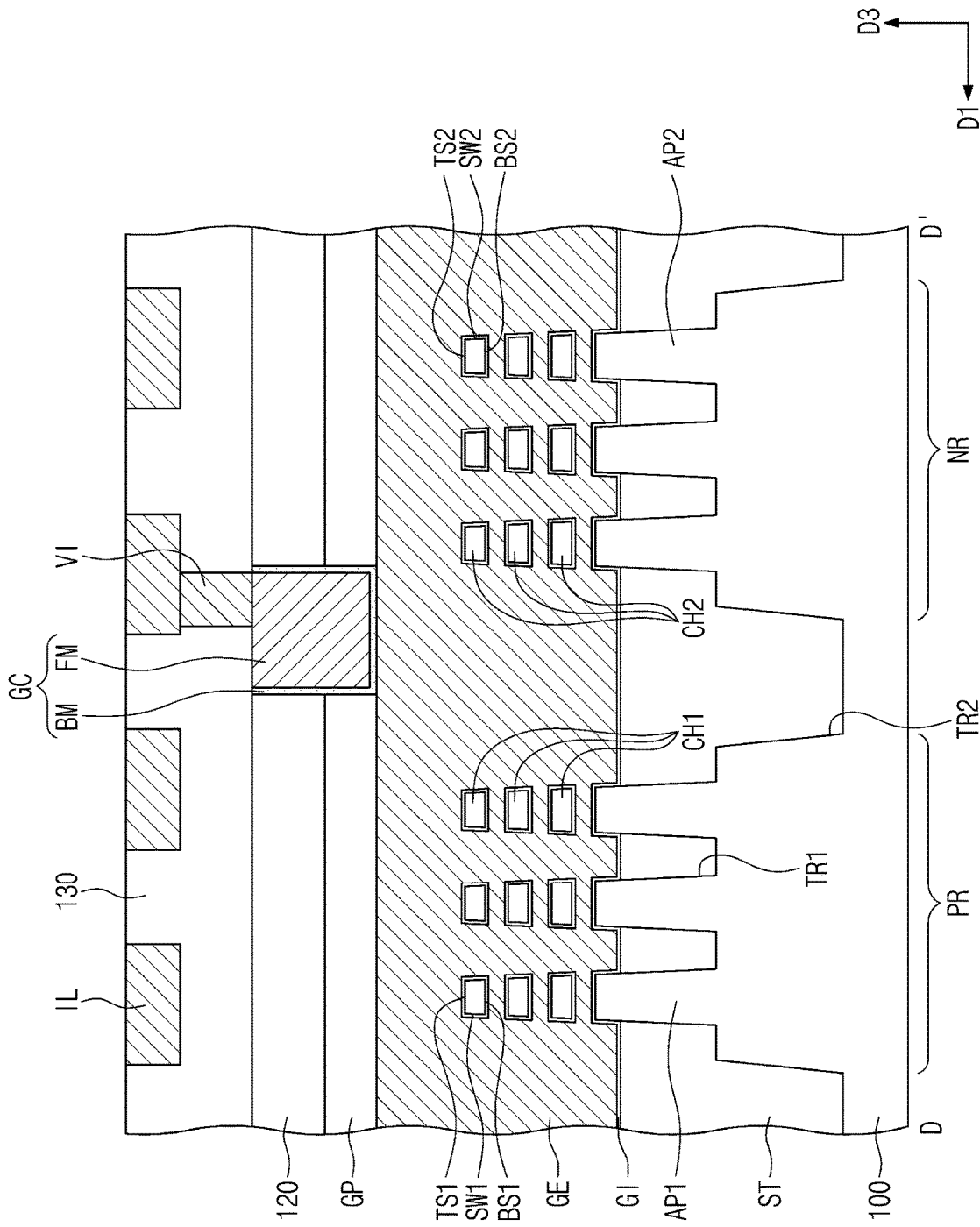

The gate electrode GE may surround each of the first and second channel patterns CH1 and CH2 (see FIG. 14D). The gate electrode GE may be provided on a first top surface TS1, at least one first sidewall SW1, and a first bottom surface BS1 of the first channel pattern CH1. The gate electrode GE may be provided on a second top surface TS2, at least one second sidewall SW2, and a second bottom surface BS2 of the second channel pattern CH2. For example, the gate electrode GE may surround a top surface, a bottom surface and opposite sidewalls of each of the first and second channel patterns CH1 and CH2. In this sense, a transistor according to the present embodiment may be a three-dimensional field effect transistor such as a multi-bridge channel field effect transistor (MBCFET) in which the first and second channel patterns CH1 and CH2 are three-dimensionally surrounded by the gate electrode GE.

A gate dielectric pattern GI may be provided between the gate electrode GE and each of the first and second channel patterns CH1 and CH2. The gate dielectric pattern GI may surround each of the first and second channel patterns CH1 and CH2.

On the second active region NR, a dielectric pattern IP may be interposed between the gate dielectric pattern GI and the second source/drain pattern SD2. The gate electrode GE may be spaced apart from the second source/drain pattern SD2 across the gate dielectric pattern GI and the dielectric pattern IP. In contrast, no dielectric pattern IP may be provided on the first active region PR.

A first interlayer dielectric layer 110 and a second interlayer dielectric layer 120 may be provided on an entire surface of the substrate 100. The active contacts AC may be provided to penetrate the first and second interlayer dielectric layers 110 and 120 and to correspondingly have connection with the first and second source/drain patterns SD1 and SD2. The gate contact GC may be provided to penetrate the second interlayer dielectric layer 120 and the gate capping pattern GP and to have connection with the gate electrode GE.

A third interlayer dielectric layer 130 may be provided on the second interlayer dielectric layer 120. The third interlayer dielectric layer 130 may be provided therein with a first wiring layer including a plurality of connection lines IL and a plurality of vias VI.

A semiconductor device according to the present inventive concepts may be configured such that source/drain patterns of PMOSFET may have their buffer layers that prevent stacking faults between active patterns and main layers of the source/drain patterns. As a result, the PMOSFET may decrease in channel resistance. Moreover, the main layer of the source/drain pattern may securely have a volume greater than a certain value, which may result in an increase in performance of PMOSFET.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising: a first active pattern that extends in a first direction on a first active region of a substrate;
a first source/drain pattern in a recess of an upper portion of the first active pattern;
a gate electrode that runs across a first channel pattern of the upper portion of the first active pattern, wherein the gate electrode extends in a second direction different from the first direction and is provided on a top surface and at least one sidewall of the first channel pattern; and
an active contact electrically connected to the first source/drain pattern,
wherein, the recess, when viewed in a cross-section of the first active pattern taken along the first direction, includes:
a first inner sidewall that extends, at a first angle with respect to a bottom surface of the substrate, from a top surface of the first active pattern toward the first channel pattern; and
a second inner sidewall that extends, at a second angle with respect to the bottom surface of the substrate different from the first angle, from the first inner sidewall toward a bottom of the recess,
the first source/drain pattern includes a first layer in a lower portion of the recess and a second layer on the first layer,
the first layer covers the second inner sidewall,
the second layer covers at least a portion of the first inner sidewall, the at least a portion of the first inner sidewall being exposed by the first layer,
the first layer has a side part on the second inner sidewall and a central part on the bottom of the recess, a height of the side part being higher than a height of the central part,
the first layer and the second layer include silicon-germanium (SiGe),
a concentration of germanium (Ge) in the first layer is in a range from 10 at % to 45 at %, and
a concentration of germanium (Ge) in the second layer is in a range from 50 at % to 70 at %,
wherein each of the first angle and the second angle is measured counterclockwise with respect to the bottom surface of the substrate and is an acute angle, and
wherein a maximum width of the recess is between the bottom of the recess and a boundary between the first inner sidewall and the second inner sidewall.

2. The semiconductor device of claim 1,
wherein the central part of the first layer has a first thickness, the side part of the first layer has a second thickness, and the first thickness is greater than the second thickness,
wherein the second layer has a side part on the first inner sidewall and a central part on the central part of the first layer,
wherein the central part of the second layer has a third thickness, the side part of the second layer has a fourth thickness, and the third thickness is greater than the third thickness, and
wherein the third thickness of the central part of the second layer is less than the first thickness of the central part of the first layer.

3. The semiconductor device of claim 2, wherein
the first source/drain pattern has a maximum width in the first direction at a first level,
the second thickness is measured at the first level, and
a ratio of the second thickness to the first thickness is in a range from 0.3 to 0.7.

4. The semiconductor device of claim 1,
wherein the first layer and the second layer stacked on each other fill a space of the recess.

5. The semiconductor device of claim 1, wherein the second angle is greater than the first angle.

6. The semiconductor device of claim 1, wherein the first source/drain pattern further includes a third layer on the second layer, and
wherein a concentration of silicon (Si) in the third layer is in a range from 95 at % to 100 at %.

7. The semiconductor device of claim 1, wherein the second layer covers the first inner sidewall and at least a portion of the second inner sidewall that is exposed by the first layer.

8. The semiconductor device of claim 7, wherein the first source/drain pattern has a maximum width in the first direction at a first level, and
the height of the side part of the first layer is lower than the first level.

9. The semiconductor device of claim 1, further comprising:
a second active pattern that extends in the first direction on a second active region of the substrate; and
a second source/drain pattern in a recess of an upper portion of the second active pattern,
wherein the gate electrode runs across a second channel pattern of the upper portion of the second active pattern,
wherein the first active region is a PMOSFET region, and
wherein the second active region is an NMOSFET region.

10. The semiconductor device of claim 1, wherein
the first channel pattern includes a plurality of first channel patterns that are vertically stacked, and
the gate electrode surrounds a top surface, a bottom surface, and opposite sidewalls of each of the plurality of first channel patterns.

11. A semiconductor device, comprising:
a first active pattern, a second active pattern, and a third active pattern that are on an active region of a substrate, wherein the first to third active patterns extend in parallel to each other in a first direction and are spaced apart from each other in a second direction intersecting the first direction;
a device isolation layer that is on the substrate and covers a lower sidewall of each of the first to third active patterns, wherein an upper portion of each of the first to third active patterns protrudes upwards from a top surface of the device isolation layer;
a source/drain pattern continuously on the first to third active patterns;
a gate electrode that runs across the first to third active patterns; and
an active contact electrically connected to the source/drain pattern,
wherein
the source/drain pattern includes:
first to third first layers on the first to third active patterns, respectively, and spaced apart from each other in the second direction; and
a second layer continuously disposed on the first to third first layers,
a height of the first layer, when viewed in a cross-section of the source/drain pattern taken along the second direction, is higher than a height of the second first layer, and a height of the third first layer is higher than the height of the second first layer,
the first to third first layers and the second layer include silicon-germanium (SiGe), a concentration of germanium (Ge) in each of the first to third first layers is in a range from 10 at % to 45 at %, and
a concentration of germanium (Ge) in the second layer is in a range from 50 at % to 70 at %.

12. The semiconductor device of claim 11, wherein
the second layer, when viewed in a cross-section of the source/drain pattern taken along the second direction, has a first facet, a second facet, a third facet, and a fourth facet,
a first edge is defined where the first facet and the second facet meet each other, and
a second edge is defined where the third facet and the fourth facet meet each other.

13. The semiconductor device of claim 12, wherein the source/drain pattern further includes a third layer that covers the first to fourth facets of the second layer,
wherein a concentration of silicon (Si) in the third layer is in a range from 95 at % to 100 at %.

14. The semiconductor device of claim 13, further comprising a silicide pattern between the source/drain pattern and the active contact,
wherein, when viewed in a cross-section of the source/drain pattern taken along the second direction, the silicide pattern is in contact with a top surface of the second layer and a top surface of the third layer.

15. The semiconductor device of claim 11, wherein the second layer include a first second layer with the first facet, the second facet, a fifth facet and a sixth facet on the first active pattern, a second layer with seventh to tenth facets on the second active pattern, and a third second layer with the third facet, the fourth facet, an eleventh facet, and a twelfth facet on the third active pattern, and
wherein the first second layer and the second layer are merged to each other and the second layer and the third second layer are merged to each other.

16. A semiconductor device, comprising:
an active pattern that extends in a first direction on a PMOSFET region of a substrate;
a device isolation layer that is on the substrate and covers a lower sidewall of the active pattern, an upper portion of the active pattern protruding upwards from a top surface of the device isolation layer;
a source/drain pattern in a recess between channels on the upper portion of the active pattern;
a gate electrode that runs across the upper portion of the active pattern, the gate electrode extending in a second direction different from the first direction;
a first interlayer dielectric layer on the source/drain pattern and the gate electrode;
an active contact that penetrates the first interlayer dielectric layer and is electrically connected to the source/drain pattern;
a gate contact that penetrates the first interlayer dielectric layer and is electrically connected to the gate electrode;
a silicide pattern between the source/drain pattern and the active contact;
a second interlayer dielectric layer on the first interlayer dielectric layer;
a first connection line and a second connection line in the second interlayer dielectric layer;
a first via that electrically connects the first connection line to the active contact; and
a second via that electrically connects the second connection line to the gate contact,
wherein the recess, when viewed in a cross-section of the active pattern taken along the first direction, includes:

a first inner sidewall that extends, at a first angle with respect to a bottom surface of the substrate, from a top surface of the active pattern toward the channel; and a second inner sidewall that extends, at a second angle with respect to the bottom surface of the substrate different from the first angle, from the first inner sidewall toward a bottom of the recess, wherein the source/drain pattern includes a first layer in a lower portion of the recess and a second layer on the first layer, the first layer covers the second inner sidewall, the second layer covers at least a portion of the first inner sidewall that is exposed by the first layer, the first layer includes a side part on the second inner sidewall and a central part on the bottom of the recess, a height of the side part being higher than a height of the central part, the first layer and the second layer include silicon-germanium (SiGe), a concentration of germanium (Ge) in the first layer is in a range from 10 at % to 45 at %, and a concentration of germanium (Ge) in the second layer is in a range from 50 at % to 70 at %, wherein each of the first angle and the second angle is measured counterclockwise with respect to the bottom surface of the substrate and is an acute angle, and wherein a maximum width of the recess is between the bottom of the recess and a boundary between the first sidewall and the second sidewall.

17. The semiconductor device of claim 16, wherein the central part of the first layer has a first thickness, the side part of the first layer has a second thickness, the source/drain pattern has a maximum width in the first direction at a first level, the second thickness is measured at the first level, and a ratio of the second thickness to the first thickness is in a range from 0.3 to 0.7.

18. The semiconductor device of claim 16, wherein the first and second layers stacked on each other fill a space of the recess.

19. The semiconductor device of claim 16, wherein the source/drain pattern further includes a third layer stacked on second main layer, wherein a concentration of silicon (Si) in the third layer is in a range from 95 at % to 100 at %.

20. The semiconductor device of claim 16, wherein the first layer includes a first semiconductor layer and a second semiconductor layer on the first semiconductor layer, wherein a concentration of germanium (Ge) in the second semiconductor layer is greater than a concentration of germanium (Ge) in the first semiconductor layer, the first semiconductor layer has a first thickness on the bottom of the recess, the second semiconductor layer has a second thickness on the bottom of the recess, and the second thickness is greater than the first thickness.

* * * * *